(12) United States Patent
Phung

(10) Patent No.: US 11,545,974 B2
(45) Date of Patent: Jan. 3, 2023

(54) CURRENT BIASED TUNABLE QUBIT

(71) Applicant: International Business Machines Corporation, Armonk, NY (US)

(72) Inventor: Timothy Phung, Milpitas, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 121 days.

(21) Appl. No.: 17/031,369

(22) Filed: Sep. 24, 2020

(65) Prior Publication Data
US 2022/0094358 A1    Mar. 24, 2022

(51) Int. Cl.
| | |
|---|---|
| *G06N 10/00* | (2022.01) |
| *H03K 17/92* | (2006.01) |
| *G06F 30/394* | (2020.01) |
| *H01L 27/18* | (2006.01) |

(52) U.S. Cl.
CPC .......... *H03K 17/92* (2013.01); *G06F 30/394* (2020.01); *G06N 10/00* (2019.01); *H01L 27/18* (2013.01)

(58) Field of Classification Search
CPC ........ H03K 17/92; G06N 10/00; G06F 30/00; H01L 27/18
See application file for complete search history.

(56) References Cited

U.S. PATENT DOCUMENTS

| | | | |
|---|---|---|---|
| 6,900,454 B2 | 5/2005 | Blais et al. | |
| 9,685,935 B2 | 6/2017 | Strand et al. | |
| 10,560,103 B2 | 2/2020 | Reagor et al. | |
| 2006/0290553 A1* | 12/2006 | Furuta | H03K 3/38 341/155 |
| 2015/0349780 A1* | 12/2015 | Naaman | H03K 19/1958 326/5 |
| 2018/0358539 A1 | 12/2018 | Goto | |
| 2019/0392878 A1 | 12/2019 | Murduck et al. | |
| 2020/0287540 A1* | 9/2020 | Smith | H01L 27/18 |

OTHER PUBLICATIONS

International Search Report and Written Opinion for International Patent Application No. PCT/EP2021/075854 dated Jan. 28, 2022, 14 pages.

(Continued)

*Primary Examiner* — Dinh T Le
(74) *Attorney, Agent, or Firm* — Amin, Turocy & Watson, LLP

(57) ABSTRACT

Techniques for designing, creating, and utilizing a current biased tunable qubit are presented. A qubit device can comprise a first Josephson junction (JJ) located along a first current path of the device, and a second JJ and third JJ coupled in series along a second current path in parallel with the first current path, wherein the second and third JJs facilitate controlling frequency of the device. The first JJ can be larger in area than each of the second and third JJs, wherein a current splitting ratio between the first current path and second current path can be increased thereby. The device can comprise a capacitor with a first terminal associated with the second and third JJs, and a second terminal associated with ground. Alternatively, a high kinetic inductance wire can be used in the first current path, instead of the JJ.

20 Claims, 27 Drawing Sheets
(22 of 27 Drawing Sheet(s) Filed in Color)

(56) References Cited

OTHER PUBLICATIONS

Kockum et al., "Quantum bits with Josephson junctions," arXiv:1908.09558v1 [quant-ph] Aug. 26, 2019, 41 pages.
Wei et al., "Coupling Josephson qubits via a current-biased information bus," Europhys. Lett., 67 (6), Sep. 15, 2004, 7 pages.
Clarke et al., "The SQUID Handbook vol. II: Applications of SQUIDs and SQUID Systems," Wiley-VCH; Weinheim (Germany), Aug. 7, 2006, 652 pages.
Tesche et al., "dc SQUID: Noise and Optimization," Journal of Low Temperature Physics, vol. 29, Nos. 3/4, 1977, 31 pages.
Bialczak et al., "1/f Flux Noise in Josephson Phase Qubits," Physical Review Letters, PRL 99, 187006, Nov. 2, 2007, 4 pages.
Dicarlo et al., "Demonstration of two-qubit algorithms with a superconducting quantum processor," Nature, vol. 460, Jul. 9, 2009, 5 pages.
Kelly, "Fault-tolerant superconducting qubits," University of California Santa Barbara, Mar. 2015, 205 pages.
Krinner et al., "Engineering cryogenic setups for 100-qubit scale superconducting circuit systems," EPJ Quantum Technology, 6, Article No. 2, May 28, 2019, 29 pages.
Abrams et al., "Methods for Measuring Magnetic Flux Crosstalk between Tunable Transmons," Physical Review Applied 12, 064022 (2019), 11 pages.
Blais et al., "Tunable Coupling of Superconducting Qubits," Physical Review Letters, vol. 90, No. 12, Mar. 28, 2003, 4 pages.
Bialczak et al., "Fast Tunable Coupler for Superconducting Qubits," Physical Review Letters, PRL 106, 060501, Feb. 11, 2011, 4 pages.
Steffen et al., "Accurate control of Josephson phase qubits," Physical Review B 68, 224518 (2003), 9 pages.
Braumuller et al., "Characterizing and Optimizing Qubit Coherence Based on SQUID Geometry," Physical Review Applied 13, 054079 (2020), 11 pages.
Xu et al., "Frequency-tunable high-Q superconducting resonators via wireless control of nonlinear kinetic inductance," Appl. Phys. Lett. 114, 192601 (2019), 5 pages.

* cited by examiner

CURRENT BIASED TUNABLE QUBIT

BACKGROUND

The subject disclosure relates to quantum circuitry, and more specifically, to a current biased tunable qubit.

SUMMARY

The following presents a summary to provide a basic understanding of one or more embodiments of the disclosed subject matter. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, methods, apparatuses, and/or computer program products that can facilitate creating, designing, and/or utilizing a current biased tunable qubit are presented.

According to an embodiment, a device can comprise a first Josephson junction located along a first current path of the device. The device also can comprise a second Josephson junction and a third Josephson junction coupled in series along a second current path of the device in parallel with the first current path.

Another embodiment relates to a method that can comprise forming a first Josephson junction along a first current path of a device. The method also can comprise forming a second Josephson junction and a third Josephson junction that are coupled in series along a second current path of the device in parallel with the first current path.

A further embodiment relates to a qubit device that can comprise a high kinetic inductance wire located along a first current path of the device, wherein the high kinetic inductance wire has a kinetic inductance level that satisfies a defined threshold kinetic inductance level. The qubit device also can comprise a first Josephson junction and a second Josephson junction coupled in series along a second current path of the device in parallel with the first current path.

These and other features will become apparent from the following detailed description of illustrative embodiments thereof, which is to be read in connection with the accompanying drawings.

DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
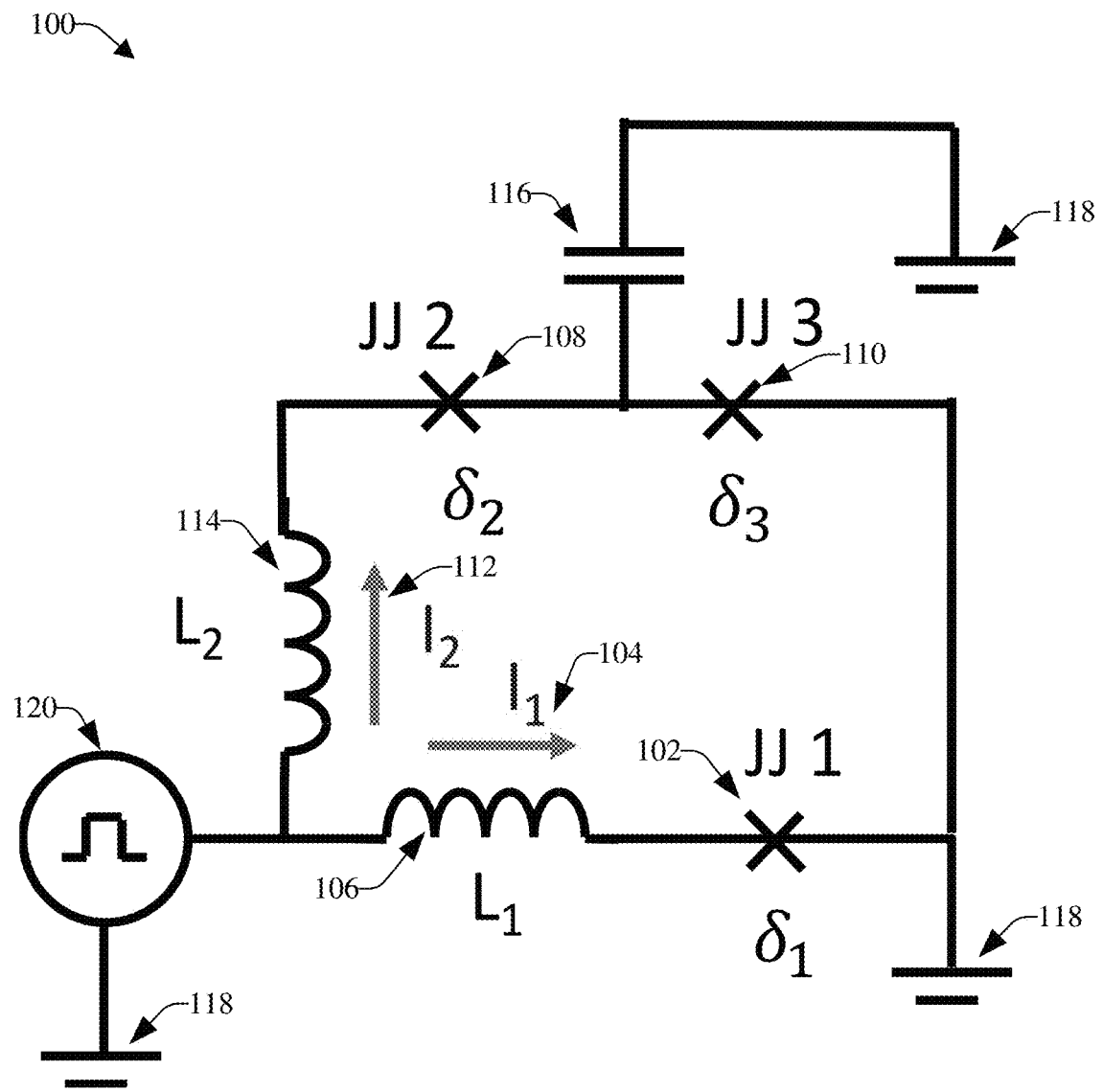
FIG. 1 illustrates a diagram of an example, non-limiting device that can be utilized to provide desirable current biased frequency tuning, in accordance with various aspects and embodiments of the disclosed subject matter.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Frequency tunable qubit devices can be useful and desirable in many quantum computing architectures. Frequency tunable qubit devices can be used for parametric operations, or as a tunable coupling device, for example. It can be desirable (e.g., ideal or optimal) for a frequency tunable qubit device to have low loss and high coherence.

There are frequency tunable devices based on superconducting quantum interference devices (SQUIDs) that can be tuned using a magnetic field generated either on chip or with an external coil. While tunable qubit devices using magnetic field-tuned SQUIDs are possible, these devices can be deficient in numerous ways, as they can suffer from undesirable universal flux noise and/or magnetic crosstalk, and/or can require relatively high and undesirable levels of current (e.g., approximately 1 milliampere (mA)) in order to operate.

As a result, it can be desirable to have frequency tunable devices that do not suffer from these and/or other deficiencies. For instance, it can be desirable to create, realize, or develop a desirably designed current controlled qubit (e.g., current controlled coupler) that can have higher performance and can be more efficient (e.g., by utilizing or requiring less current to achieve a desirable tuning range or similar tuning range as SQUID-based frequency tunable devices), desirably compact, and less sensitive to flux noise and magnetic crosstalk.

To that end, the various embodiments described herein relate to techniques for designing, creating, and/or utilizing a current biased frequency tunable qubit are presented. In some embodiments, a device (e.g., qubit device) can comprise a first Josephson junction located along a first current path of the device, and a second Josephson junction and third Josephson junction can be coupled in series along a second current path in parallel with the first current path, wherein the second and third Josephson junctions can facilitate controlling a frequency of the device. In certain embodiments, the device can be a transmon qubit device. There also can be a first inductive component (e.g., a first wire having a first amount of inductance) located along the first current path, and a second inductive component (e.g., a second wire having a second amount of inductance) located along the second current path. The device also can comprise a capacitor component (e.g., a capacitor) that can have a first terminal associated with the second and third Josephson junctions, and a second terminal associated with the ground of the device.

In some embodiments, the first Josephson junction can be larger (e.g., significantly larger) in area than each of the second and third Josephson junctions, wherein a current splitting ratio between the first current path and second current path can be increased based at least in part on the first Josephson junction being larger in area than the second Josephson junction and the third Josephson junction. The frequency of the device can be controlled based at least in part on an amount of current applied to the device and the arrangement of the second Josephson junction and the third Josephson junction in relation to the first Josephson junction.

Alternatively (or additionally), in other embodiments, a device can have a high kinetic inductance wire in the first current path, instead of (or in addition to) a Josephson junction. For instance, a device (e.g., qubit device) can comprise a high kinetic inductance wire located along a first current path of the device, wherein the high kinetic inductance wire can have a kinetic inductance level that can satisfy a defined threshold kinetic inductance level. The device also can comprise a first Josephson junction and a second Josephson junction that can be coupled in series along a second current path of the device in parallel with the first current path. The first Josephson junction and the second Josephson junction can facilitate adjusting a frequency of the device.

There also can be a first inductive component (e.g., first wire having a first amount of inductance (in addition to the inductance of the high kinetic inductance wire)) located along the first current path, and a second inductive component (e.g., second wire having a second amount of inductance) located along the second current path. The device also can comprise a capacitor component (e.g., a capacitor) that can have a first terminal associated with the first and second Josephson junctions, and a second terminal associated with the ground of the device.

The frequency of the qubit device can be adjusted based at least in part on an amount of current applied to the device and an arrangement of the first Josephson junction and the second Josephson junction in relation to the high kinetic inductance wire. A current splitting ratio between the first current path and the second current path can be based at least in part on a relationship between the high kinetic inductance wire, the first Josephson junction, and the second Josephson junction.

These and other aspects and embodiments of the disclosed subject matter will now be described with respect to the drawings.

FIG. 1 illustrates a diagram of an example, non-limiting device 100 that can be utilized to provide desirable (e.g., enhanced, suitable, acceptable, or optimal) current biased frequency tuning, in accordance with various aspects and embodiments of the disclosed subject matter. In some embodiments, the device 100 can be a qubit device (e.g., a current biased frequency tunable qubit device), such as, for example, a transmon qubit device.

The device 100 can comprise a first Josephson junction component 102 (JJ1) that can be located along a first current path 104 which can have a first current ($I_1$) (e.g., when current is supplied to the device 100). The first current path 104 also can include a first inductive component 106 that can be associated with the first Josephson junction component 102. The first inductive component 106 can be or can comprise a first wire of a desired conductive material, wherein the first inductive component 106 can have a first level of inductance ($L_1$). A Josephson junction can be a quantum mechanical device that can comprise two superconducting components (e.g., superconducting electrodes) that can be separated from each other by a relatively thin barrier (e.g., a barrier formed of a non-superconducting or insulator material), wherein the barrier can be or can comprise, for example, a relatively thin insulating tunnel barrier, a desired metal material, a semiconductor, or a desired magnetic material (e.g., a ferromagnet).

The device 100 also can comprise a second Josephson junction component 108 (JJ2) and third Josephson junction component 110 (JJ3) that can be coupled in series along a second current path 112 in parallel with the first current path 104, wherein the second current path 112 can have a second current ($I_2$) (e.g., when current is supplied to the device 100), and wherein the second Josephson junction component 108 and third Josephson junction component 110 can facilitate controlling a frequency of the device 100, as more fully described herein. For instance, when using a current source (e.g., current generator component) to control (e.g., adjust or tune) the frequency (e.g., qubit frequency) of the device 100, and control the second Josephson junction component 108 and third Josephson junction component 110, to the current source, the second Josephson junction component 108 and third Josephson junction component 110 can be in series with each other in the second current path 112. That is, from the perspective of the current source, the second Josephson junction component 108 and third Josephson junction component 110 can be in series with each other. The second current path 112 also can include a second inductive component 114 that can be associated with the second Josephson junction component 108 and third Josephson junction component 110. The second inductive component 114 can be or can comprise a second wire of a desired conductive material, wherein the second inductive component 114 can have a second level of inductance ($L_2$). The first level of inductance of the first inductive component 106 can comprise, for example, self inductance or effective inductance of the first inductive component 106 (e.g., self inductance or effective inductance of the first wire), and the second level of inductance of the second inductive component 114 can comprise, for example, self inductance or effective inductance of the second inductive component 114 (e.g., self inductance or effective inductance of the second wire).

The device 100 also can comprise a capacitor component 116 (e.g., a capacitor) that can have a first terminal associated with (e.g., connected with the second current path between) the second Josephson junction component 108 and third Josephson junction component 110, and a second terminal that can be associated with (e.g., connected to) the ground 118 of the device 100. When considering the second Josephson junction component 108 and third Josephson junction component 110 from the perspective of the capacitor component 116 (e.g., qubit capacitor) of the device 100, the second Josephson junction component 108 and third Josephson junction component 110 can appear to be in parallel in relation to the capacitor component 116, although, again, from the perspective of the current source, the second Josephson junction component 108 and third Josephson junction component 110 can be coupled in series with each other in the second current path 112. In one non-limiting example, the capacitor component 116 can be 60 femtofarads (fF), although a capacitor of another desired capacitance greater than or less than 60 fF can be utilized in the device 100, as desired or appropriate.

The device 100 also can include a current generator component 120 (e.g., a current pulse generator) that can generate a desired current (e.g., a current pulse having a desired pulse form) having a desired current level. The current generator component 120 can apply or supply a desired current bias to the circuit loop (e.g., superconducting circuit loop), comprising the first current path 104 and second current path 112, to facilitate controlling tuning the frequency of the device 100, wherein a first portion of the current can flow through the first current path 104 and a second portion of the current can flow through the second current path 112, based at least in part on the respective sizes (e.g., respective areas) of the first Josephson junction component 102 associated with the first current path 104 and the second Josephson junction component 108 and third Josephson junction component 110 associated with the second current path 112. As the respective portions of current flow through the first current path 104 and second current path 112, the respective portion of current can be used to change the respective phase differences across the Josephson junctions (e.g., 102, 108, and 110), wherein the phase differences (e.g., superconducting phase differences) across the respective Josephson junctions can be represented by $\delta_1$ for the first Josephson junction component 102, $\delta_2$ for the second Josephson junction component 108, and $\delta_3$ for the third Josephson junction component 110. When the phase difference for a Josephson junction is changed, the inductance (e.g., the amount or level of inductance) for that Josephson junction can be correspondingly changed.

In some embodiments, the first Josephson junction component 102 can be larger (e.g., significantly larger) in area than each of the second Josephson junction component 108 and third Josephson junction component 110. For instance, the first area of the first Josephson junction component 102 can be approximately 100 times larger, or more or less than 100 times larger (e.g., 50 times larger, 60 times larger, 70 times larger, . . . , 110 times larger, 120 times larger, . . . ), as desired, than the second area of the second Josephson junction component 108 and the third area of the third Josephson junction component 110. In certain embodiments, the sizes of the second Josephson junction component 108 and third Josephson junction component 110 can be the same, although, if and as desired, in other embodiments, the sizes of the second Josephson junction component 108 and third Josephson junction component 110 can be different from each other.

A current splitting ratio between the first current path 104 and second current path 112 (e.g., $I_2/I_1$) can be increased based at least in part on the first Josephson junction component 102 being larger in area than the second Josephson junction component 108 and the third Josephson junction component 110. The frequency of the device 100 can be controlled (e.g., managed, adjusted, modified, or tuned) based at least in part on an amount of current applied to the device 100 by the current generator component 120, the arrangement of the second Josephson junction component 108 and third Josephson junction component 110 in relation to the first Josephson junction component 102, and the size (e.g., area) of the first Josephson junction component 102 in relation to (e.g., as compared to) the sizes of the second Josephson junction component 108 and third Josephson junction component 110.

Notably and desirably, the device 100, which can be a current controlled frequency tunable device, and can utilize three Josephson junctions (e.g., first, second, and third Josephson junction components 102, 108, and 110) as arranged in the circuitry of the device 100, can use the applied current (e.g., supplied from the current generator component 120) through a Josephson junction to change the inductance of the Josephson junction, where $I = I_c \sin \delta$, and where the induction for a Josephson junction ($L_{JJ}$) can be determined, for example, as follows in Equation (Eq.) (1):

$$L_{JJ} = \frac{\hbar}{2e\sqrt{I_c^2 - I^2}}. \quad \text{Eq. (1)}$$

Traditional tunable qubit or coupler devices that employ Josephson junctions, however, use a magnetic field generated from a current line to tune the qubit frequency, and the current loop are electrically isolated from the circuit that contains the Josephson junctions, and the current loop are only associated with or coupled with the circuit that contains the Josephson junctions through mutual inductance from the magnetic field generated by the current loop. There is no direct current path from the current bias to the Josephson junctions. In such traditional tunable qubit or coupler devices, the magnetic field (e.g., flux threaded through a SQUID loop) can change the difference in the Josephson junction phases, and hence, Josephson junction inductance, and can thus allow a change in qubit frequency. That is, in such traditional tunable qubit or coupler devices, the magnetic field (e.g., the flux threaded through a SQUID loop) controls the phase difference, associated with Josephson junction inductance, that can be used to tune qubit or coupler frequency.

In contrast, the disclosed subject matter, including the device 100 (e.g., current controlled frequency tunable device), does not have to use a magnetic field generated from a current line in order to tune the qubit frequency. Instead, the disclosed subject matter (e.g., device 100) can utilize an applied current (e.g., current supplied from the current generator component 120) through a Josephson junction (e.g., first, second, or third Josephson junction components 102, 108, or 110) to change the inductance of the Josephson junction and facilitate enabling desirable (e.g., enhanced, suitable, acceptable, or optimal) tuning of the frequency of the device, such as more fully described herein.

Figure 2:
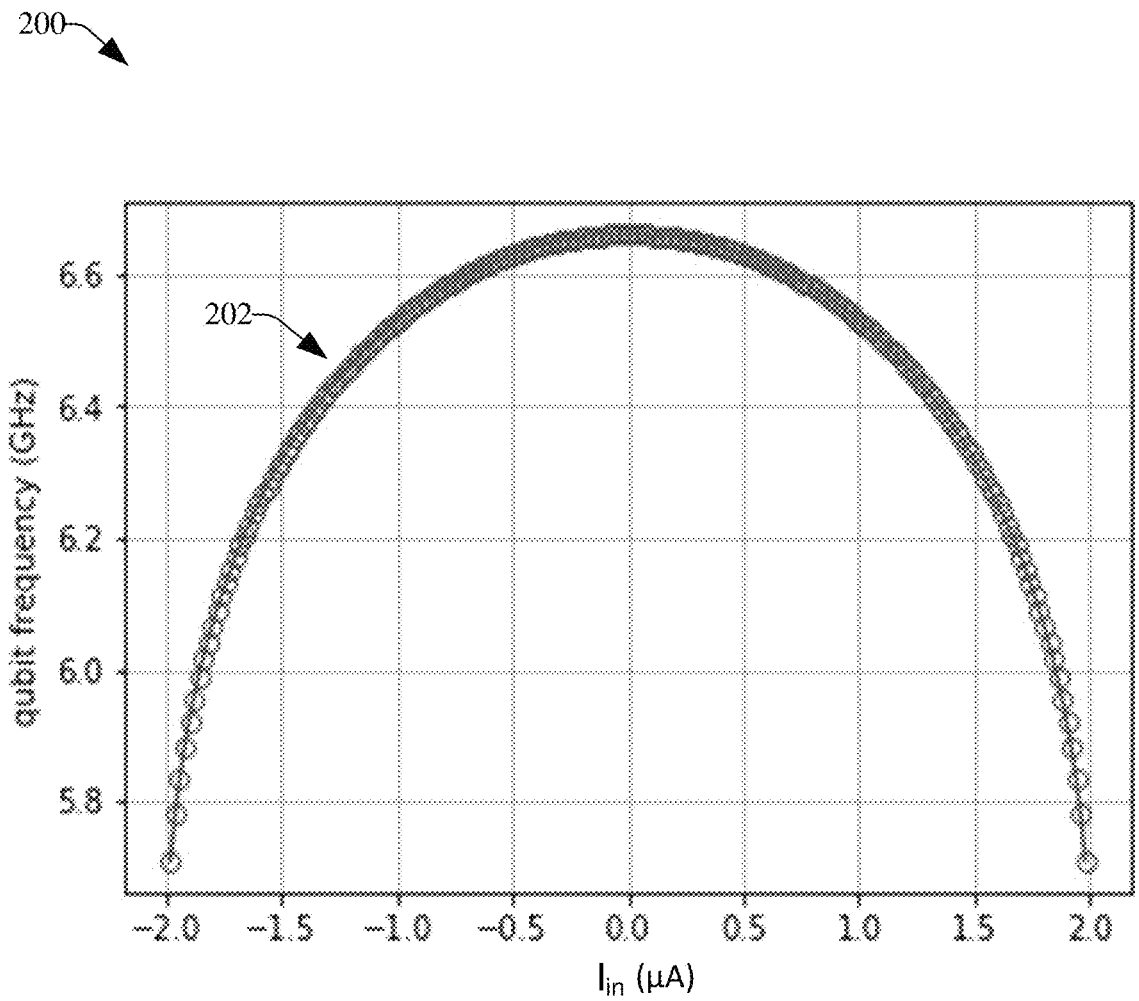
FIG. 2 depicts a diagram of an example graph of frequency (e.g., qubit frequency) of the device as a function of current, in accordance with various aspects and embodiments of the disclosed subject matter.
Figure 3:
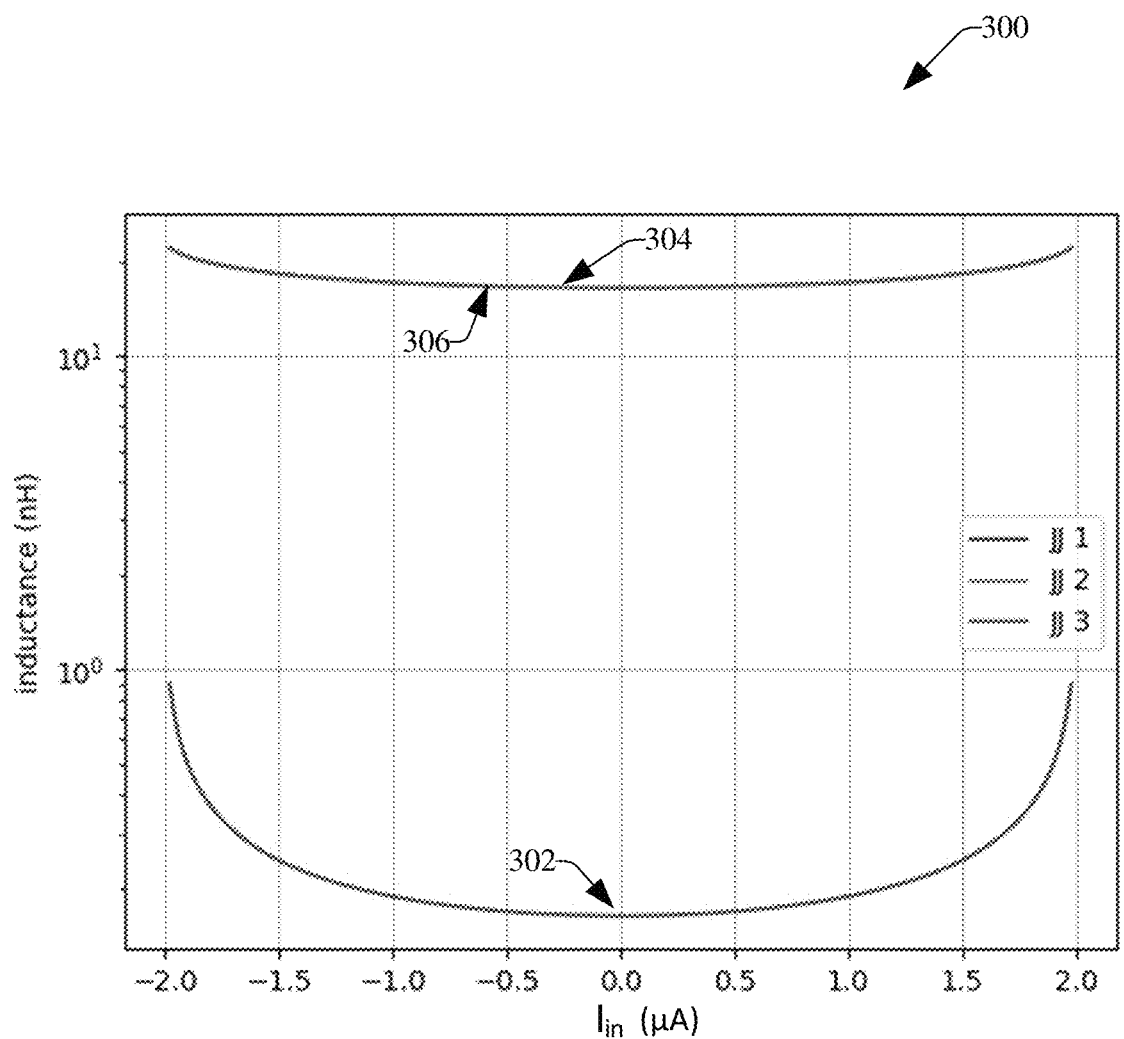
FIG. 3 depicts a diagram of an example graph of inductance of the device as a function of current, in accordance with various aspects and embodiments of the disclosed subject matter.

Referring briefly to FIGS. 2 and 3 (along with FIG. 1), FIG. 2 depicts a diagram of an example graph 200 of frequency (e.g., qubit frequency) of the device 100 in gigahertz (GHz) as a function of current in microamps (µA), and FIG. 3 depicts a diagram of an example graph 300 of inductance of the device 100 in nanohenries (nH) as a function of current in microamps, in accordance with various aspects and embodiments of the disclosed subject matter. In a non-limiting example, the area of the first Josephson junction component 102 can be approximately 100 times greater than the areas of the second Josephson junction component 108 and the third Josephson junction component 110. With regard to the second Josephson junction component 108 and the third Josephson junction component 110, the current $I_{C2}$ can be 20 nanoamps (nA) and the current $I_{C3}$ can be 20 nA, respectively. The current $I_{C1}$ associated with the first Josephson junction component 102 can be 2000 nA. The capacitance of the capacitor component 116 can be 65 fF. The inductance levels of the first level of inductance ($L_1$) and the second level of inductance ($L_2$) each can be 12 picohenries (pH). With the first Josephson junction component 102 arranged and sized in relation to the second Josephson junction component 108 and the third Josephson junction component 110, as described herein, the first Josephson junction component 102 can facilitate (e.g., can enable) a desirable increase in the current splitting ratio ($I_2/I_1$), which can provide for a desirable current biasing effect of the second Josephson junction component 108 and the third Josephson junction component 110. For instance, the first Josephson junction component 102 can desirably be utilized to increase the current splitting ratio ($I_2/I_1$), and most of the tuning effect (e.g., current biased tuning effect) of the device 100 can be due in part to (e.g., can occur in) the second Josephson junction component 108 and the third Josephson junction component 110.

In the graph 200 of FIG. 2, from the plot 202 of the frequency as a function of current, $I_{in}$, for the device 100, it can be observed that, for 10% tuning from a desired frequency spot (e.g., a sweet-spot frequency, such as approximately 6.65 GHz at 0.0 µA), the device 100 (e.g., current biased qubit device) can involve the use of only approximately 1.85 µA. In contrast, a typical field-based device (e.g., a magnetic field-tuned transmon device) can require significantly more current (e.g., up to 34 µA) in order to achieve 10% tuning from a desired frequency spot (e.g., sweet-spot frequency). The sweet-spot frequency can be the top of the curve of the plot 202, or can be at another desired frequency.

With regard to the graph 300 of FIG. 3, the graph 300 can comprise plot 302 of the inductance of the first Josephson junction component 102 as a function of the current for the device 100. The graph 300 also can include plot 304 and 306 of the respective inductances of the second Josephson junction component 108 and third Josephson junction component 110 as a function of the current for the device 100 (wherein, in the graph 300, plot 304 and plot 306 overlap or at least substantially overlap each other, so plot 304 and plot 306 essentially appear as though they are a single graph line).

In the graph 300, it can be observed from the plot 302 that the inductance for the first Josephson junction component 102 can be near 0.5 nH (e.g., can range between approximately 0.15 nH and approximately 0.9 nH) across the range of currents from −2.0 µA to 2.0 µA. It also can be observed from the plots 304 and 306 that the inductances for the second Josephson junction component 108 and third Josephson junction component 110 can be the same, or at least substantially the same, can be relatively higher than the inductance for the first Josephson junction component 102, and can vary more across the range of currents as compared to the inductance for the first Josephson junction component 102. For instance, the inductances for the second Josephson junction component 108 and third Josephson junction component 110 each can be approximately 17.0 nH at 0.0 μA, and can gradually increase to approximately 22.0 nH as the current changes from 0.0 μA to 2.0 μA or 0.0 μA to −2.0 μA.

The following analysis of the device 100 can provide further details regarding the three Josephson junction coupler of the device 100. The first level of inductance ($L_1$) and the second level of inductance ($L_2$) can be the geometric inductances of the two branches of the circuit of the device 100. Flux ($\Phi_1$ and $\Phi_2$) of the circuit of the device 100 due to the first current ($I_1$) and the second current ($I_2$) can be determined as follows in Equation (2) and Equation (3), respectively:

$$\Phi_1 = (L_1 - M)I_1 = \mathcal{L}_1 I_1, \quad \text{Eq. (2)}$$

$$\Phi_2 = (L_2 - M)I_2 = \mathcal{L}_2 I_2, \quad \text{Eq. (3)}$$

wherein M can be the mutual inductance between the two branches of the circuit of the device 100, and wherein M usually can be smaller than the first level of inductance ($L_1$) and the second level of inductance ($L_2$).

Total flux ($\Phi_T$) of the circuit of the device 100 can be determined as follows in Equation (4):

$$\Phi_T = \mathcal{L}_1 I_1 - \mathcal{L}_2 I_2 + \Phi_{ext}, \quad \text{Eq. (4)}$$

wherein the two branches of the circuit can give an opposite sign of the flux, and wherein $\Phi_{ext}$ can represent external flux.

Due to the condition set of phase from single valued-ness:

$$-\delta_1 + \delta_2 + \delta_3 = 2e/\hbar \oint \vec{A} \cdot d\vec{l} + 2n\pi, \text{ and} \quad \text{Eq. (5)}$$

$$-\delta_1 + \delta_2 + \delta_3 = \frac{2\pi}{\Phi_0} \int (\nabla \times \vec{A}) \cdot d\vec{s} + 2n\pi = \frac{2\pi \Phi_T}{\Phi_0} + 2n\pi, \quad \text{Eq. (6)}$$

wherein $\delta_1$ can represent the phase associated with the first Josephson junction component 102, $\delta_2$ can represent the phase associated with the second Josephson junction component 108, $\delta_3$ can represent the phase associated with the third Josephson junction component 110, and n can be a desired (e.g., arbitrary) integer value.

With Josephson junctions current relations (assuming below critical current of the device) and Kirchoff's Current Law (KCL), proceeding from Equations (4), (5), and (6), it can follow that:

$$-\delta_1 + \delta_2 + \delta_3 = \frac{\pi(\Phi_T)}{\Phi_0} + 2n\pi = \frac{2\pi(\mathcal{L}_1 I_1 - \mathcal{L}_2 I_2 + \Phi_{ext})}{\Phi_0} + 2n\pi, \quad \text{Eq. (7)}$$

$$-\sin^{-1}\left(\frac{I_1}{Ic_1}\right) + \sin^{-1}\left(\frac{I_2}{Ic_2}\right) + \sin^{-1}\left(\frac{I_3}{Ic_3}\right) = \quad \text{Eq. (8)}$$
$$\frac{2\pi(\mathcal{L}_1 I_1 - \mathcal{L}_2 I_2 + \Phi_{ext})}{\Phi_0} + 2n\pi, \text{ and}$$

$$-\sin^{-1}\left(\frac{I_{in} - I_2}{Ic_1}\right) + \sin^{-1}\left(\frac{I_2}{Ic_2}\right) + \sin^{-1}\left(\frac{I_2}{Ic_3}\right) = \quad \text{Eq. (9)}$$
$$\frac{2\pi(\mathcal{L}_1 (I_{in} - I_2) - \mathcal{L}_2 I_2 + \Phi_{ext})}{\Phi_0} + 2n\pi,$$

wherein $I_{in}$ can be the input (e.g., source) current that can be provided by the current generator component 120, wherein $I_{C_1}$ can be the critical current of the first Josephson junction component 102, wherein $I_{C_2}$ can be the critical current of the second Josephson junction component 108, and wherein $I_{C_3}$ can be the critical current of the third Josephson junction component 110. From Equation (9), $I_2$ can be solved for numerically and/or graphically for different $I_{in}$ values.

Referring to FIGS. 4-7 (along with FIG. 1), FIGS. 4-7 depict diagrams of example graphs 400, 500, 600, and 700 of respective design curves for a device (e.g., current biased frequency tunable qubit device) for different sizes of the first, second, and third Josephson junction components, in accordance with various aspects and embodiments of the disclosed subject matter. The tuning range and sensitivity of the device 100 can be modified (e.g., varied) by adjusting the sizes of the first Josephson junction component 102, second Josephson junction component 108, and third Josephson junction component 110. In that regard, $I_C = r \times 20$ nA for the graphs 400, 500, 600, and 700 of FIGS. 4-7, wherein $I_C$ can be the critical current of a Josephson junction, and a particular value of a particular r of a particular Josephson junctions can relate to a size of the particular Josephson junction. The sizes of the second Josephson junction component 108 and third Josephson junction component 110 are only increased to up to 5 (e.g., $r_2=5$ and/or $r_3=5$) to avoid undesirable capacitive loading of the qubit capacitor (e.g., capacitor component 116). It is noted that, in the respective graphs 400, 500, 600, and 700 of FIGS. 4-7, qubit capacitances have been changed to be up to approximately 400 fF to allow for keeping the maximum qubit frequency at approximately 6 GHz across all of the graphs 400, 500, 600, and 700. Also, Josephson junction capacitance (e.g., 2 fF/20 nA) is accounted for in all models depicted in the graphs 400, 500, 600, and 700. A desired tuning range or desired frequency can be determine based at least in part on the design curves (e.g., graphs 400, 500, 600, or 700, or other design curves that can be derived from the disclosed subject matter).

Figure 4:
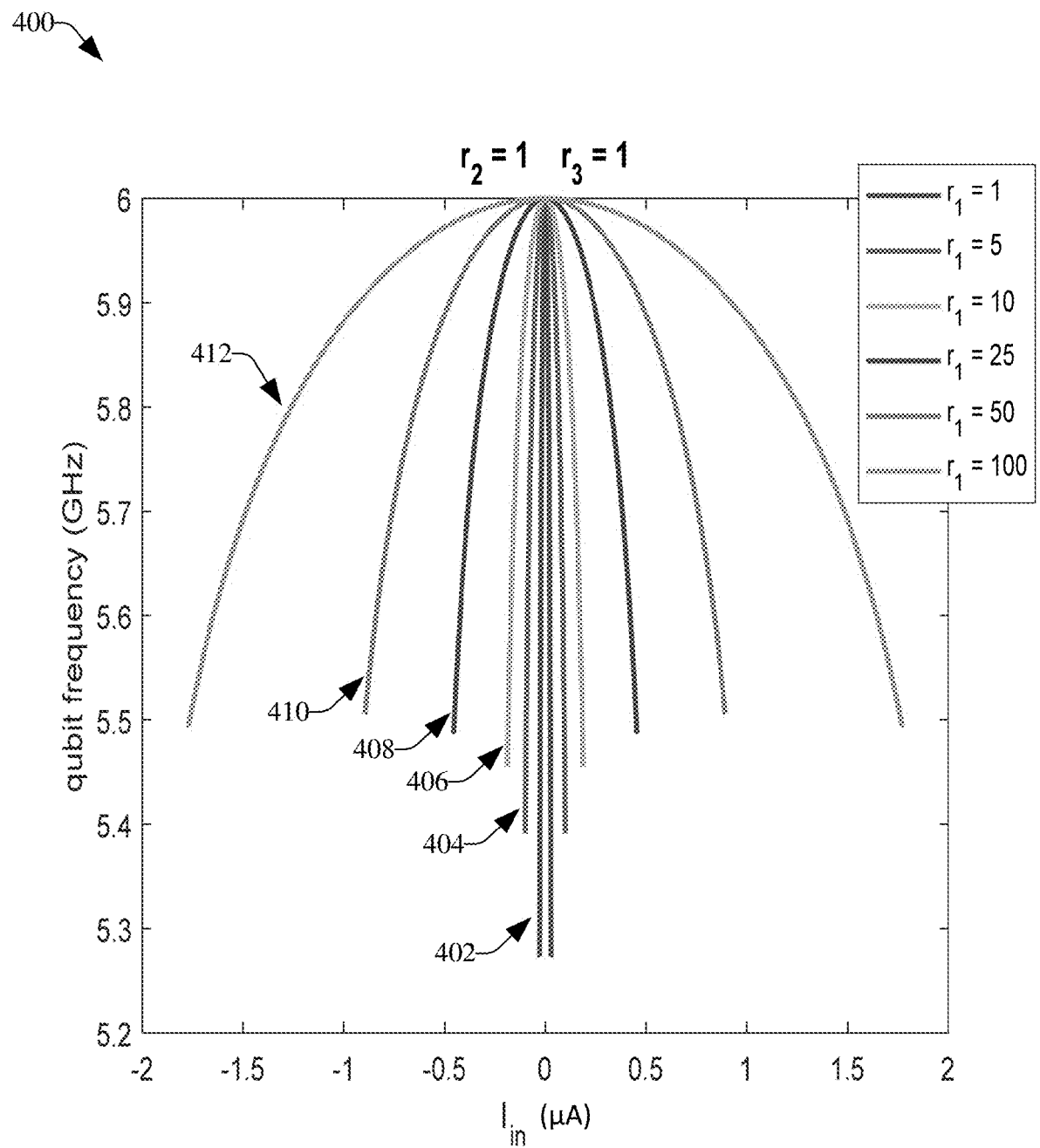
FIGS. 4-7 depict diagrams of example graphs of respective design curves for a device (e.g., current biased frequency tunable qubit device) for different sizes of first, second, and third Josephson junctions, in accordance with various aspects and embodiments of the disclosed subject matter.

FIG. 4 presents a diagram of an example graph 400 of design curves relating to the frequency (e.g., qubit frequency) of the device 100 as a function of current, $I_{in}$, for various values (e.g., size values) of $r_1$ for the first Josephson junction component 102, when the values of $r_2$ of the second Josephson junction component 108 and $r_3$ of the third Josephson junction component 110 each are set at 1, in accordance with various aspects and embodiments of the disclosed subject matter. In the graph 400, the values of $r_1$ can range from 1 to 100, with $r_2$ and $r_3$ each equal to 1. The graph 400 shows plot 402 for $r_1=1$, plot 404 for $r_1=5$, plot 406 for $r_1=10$, plot 408 for $r_1=25$, plot 410 for $r_1=50$, and plot 412 for $r_1=100$.

Figure 5:
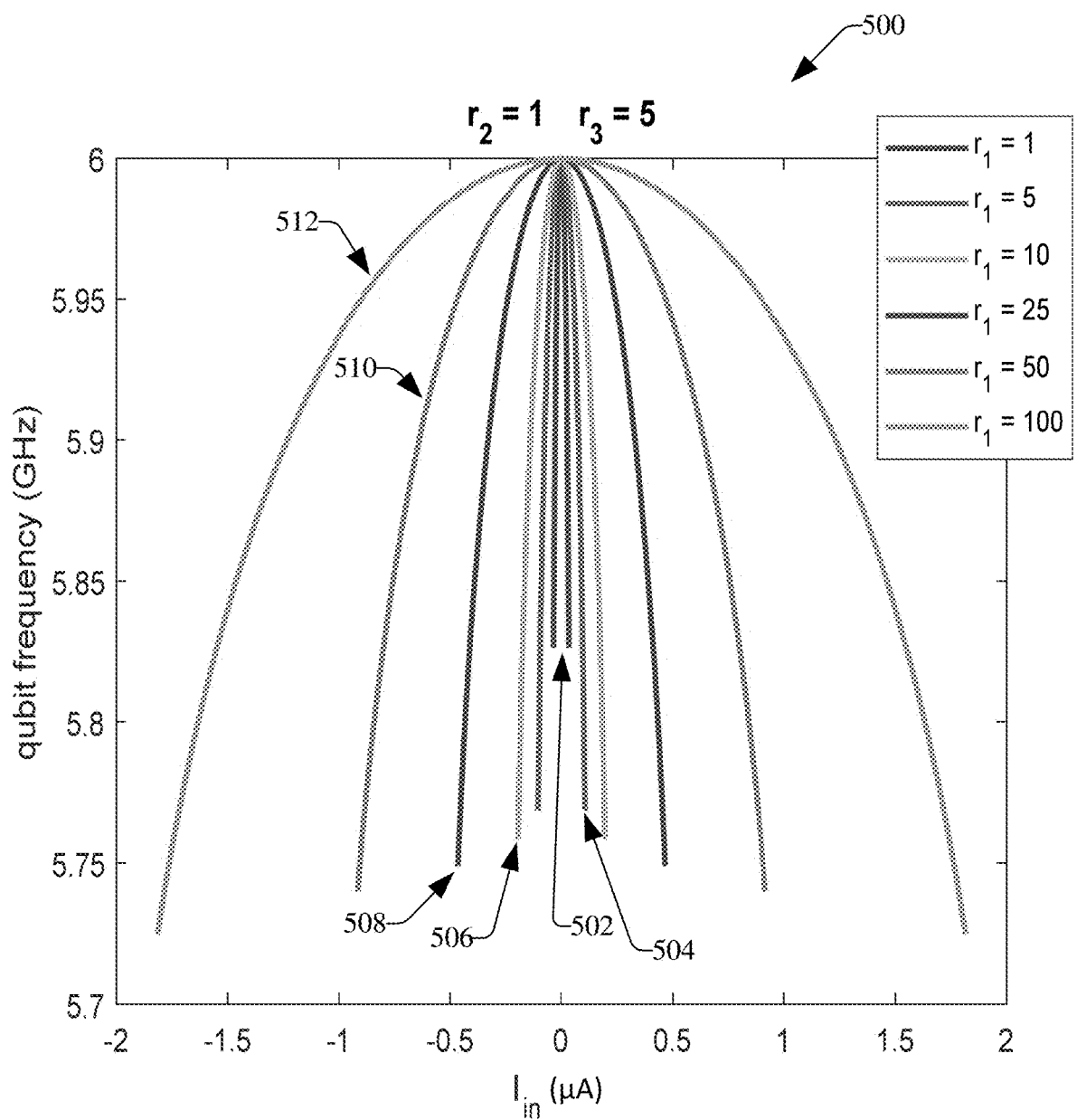

FIG. 5 illustrates a diagram of an example graph 500 of design curves relating to the frequency (e.g., qubit frequency) of the device 100 as a function of current, $I_{in}$, for various values of $r_1$ for the first Josephson junction component 102, when the value of $r_2$ of the second Josephson junction component 108 is set at 1, and the value of $r_3$ of the third Josephson junction component 110 is set at 5, in accordance with various aspects and embodiments of the disclosed subject matter. The graph 500 shows plot 502 for $r_1=1$, plot 504 for $r_1=5$, plot 506 for $r_1=10$, plot 508 for $r_1=25$, plot 510 for $r_1=50$, and plot 512 for $r_1=100$.

Figure 6:
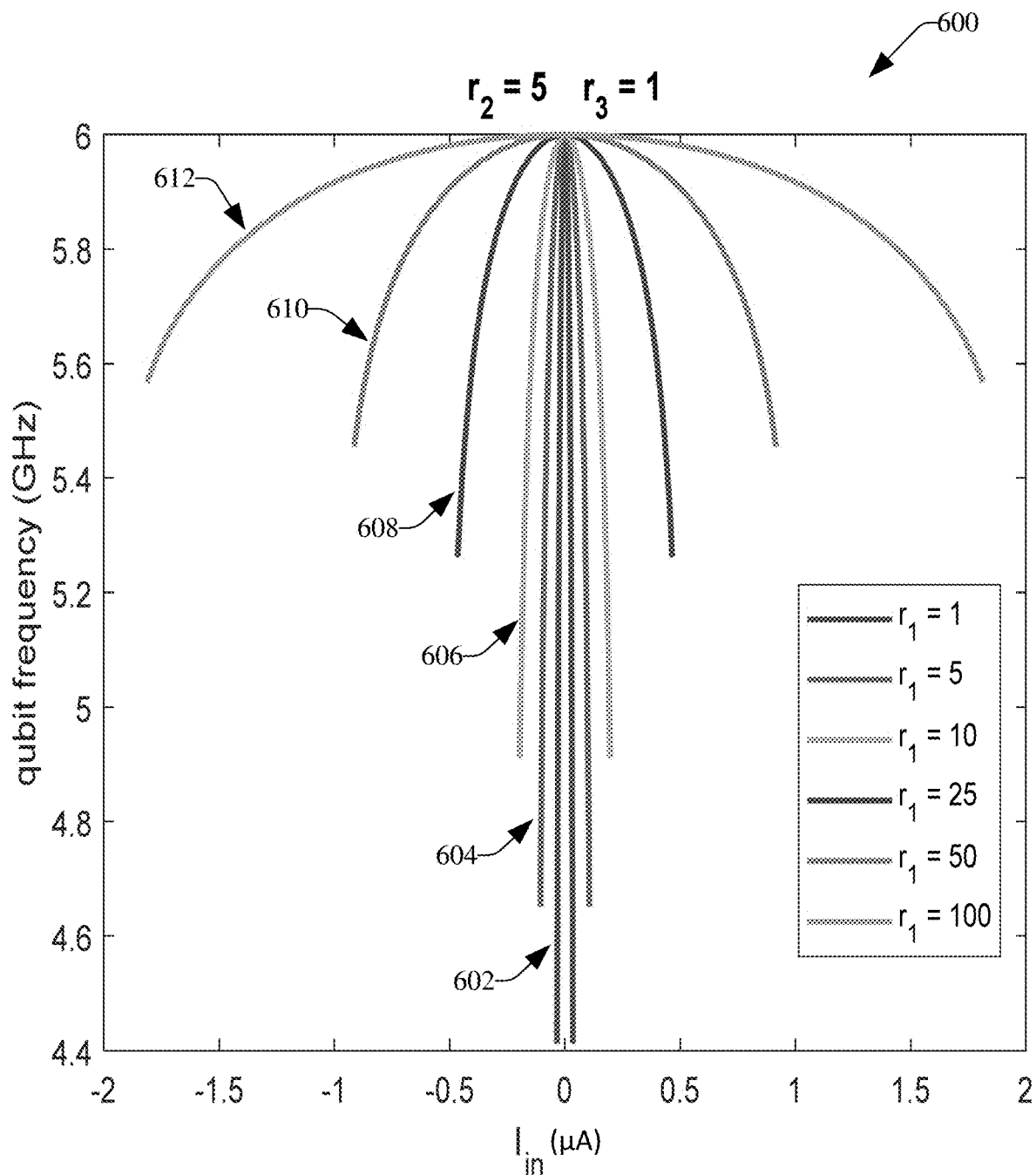

FIG. 6 depicts a diagram of an example graph 600 of design curves relating to the frequency (e.g., qubit frequency) of the device 100 as a function of current, $I_{in}$, for various values of $r_1$ for the first Josephson junction component 102, when the value of $r_2$ of the second Josephson junction component 108 is set at 5, and the value of $r_3$ of the third Josephson junction component 110 is set at 1, in accordance with various aspects and embodiments of the disclosed subject matter. The graph 600 shows plot 602 for $r_1=1$, plot 604 for $r_1=5$, plot 606 for $r_1=10$, plot 608 for $r_1=25$, plot 610 for $r_1=50$, and plot 612 for $r_1=100$.

Figure 7:
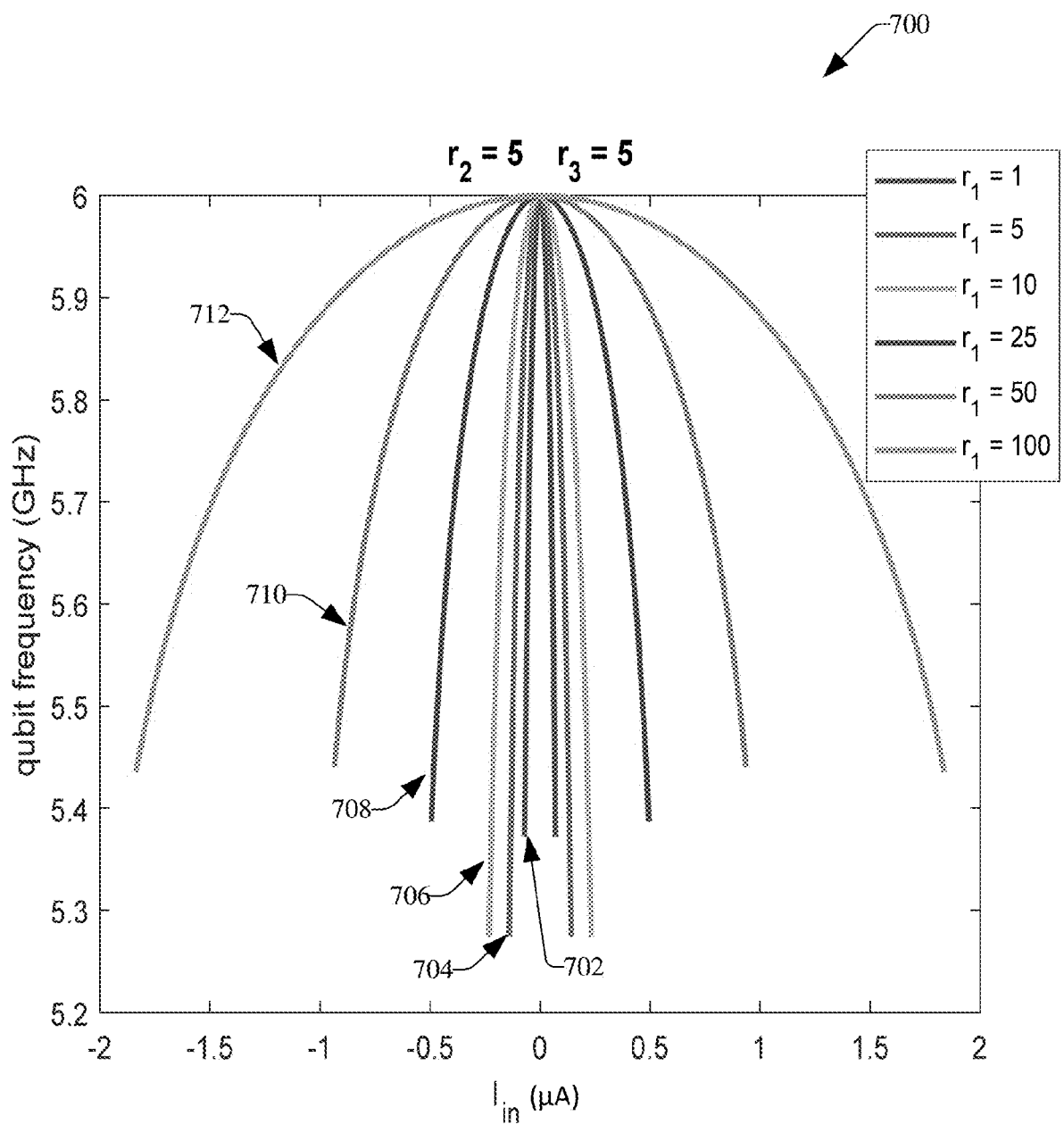

FIG. 7 presents a diagram of an example graph 700 of design curves relating to the frequency (e.g., qubit frequency) of the device 100 as a function of current, $I_{in}$, for various values of $r_1$ for the first Josephson junction component 102, when the values of $r_2$ of the second Josephson junction component 108 $r_3$ of the third Josephson junction component 110 are each set at 5, in accordance with various aspects and embodiments of the disclosed subject matter. The graph 700 shows plot 702 for $r_1=1$, plot 704 for $r_1=5$, plot 706 for $r_1=10$, plot 708 for $r_1=25$, plot 710 for $r_1=50$, and plot 712 for $r_1=100$.

As can be observed from the respective plots of the graphs 400, 500, 600, and 700, decreasing the size of the first Josephson junction component 102 (e.g., by decreasing the value of $r_1$) can provide even further increases in the $I_2/I_1$ ratio, which can provide for more frequency tuning range for the qubit device. When the first Josephson junction component 102 is selected to be approximately 100 times larger in area than the second Josephson junction component 108 and the third Josephson junction component 110 though, the first Josephson junction component 102 can still desirably increase the current splitting ratio (e.g., the $I_2/I_1$ ratio) of the device 100 and provide for a desirable frequency tuning range for the device 100.

In some instances, the device 100 potentially can be sensitive to Purcell loss and electrical noise, which can be undesirable. In some embodiments, to facilitate reducing the sensitivity of the device (e.g., current biased qubit device), a low pass filter and/or a current splitter can be utilized, which can desirably (e.g., suitably, acceptably, or optimally) reduce the sensitivity of the device to Purcell loss and electric noise.

Figure 8:
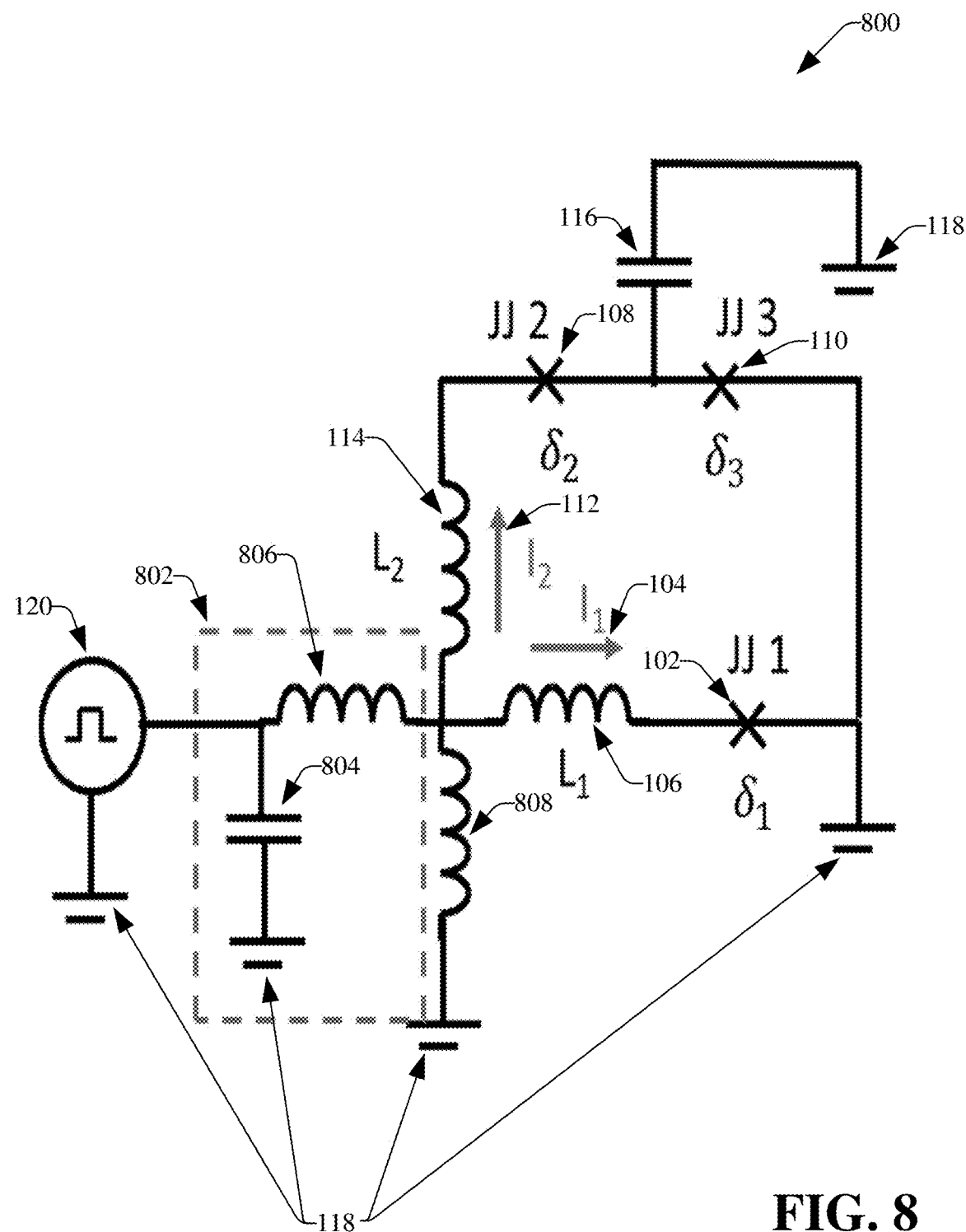
FIG. 8 illustrates a diagram of an example device that can be utilized to provide desirable current biased frequency tuning, and can employ a low pass filter and/or current splitter to facilitate reducing the sensitivity of the device to electrical noise and Purcell loss, in accordance with various aspects and embodiments of the disclosed subject matter.

In that regard, FIG. 8 illustrates a diagram of an example device 800 (e.g., example circuitry of a device) that can be utilized to provide desirable (e.g., enhanced, suitable, acceptable, or optimal) current biased frequency tuning, and can employ a low pass filter and/or current splitter to facilitate reducing the sensitivity of the device 800 to electrical noise and Purcell loss, in accordance with various aspects and embodiments of the disclosed subject matter. In some embodiments, the device 800 can be a qubit device (e.g., a current biased frequency tunable qubit device), such as, for example, a transmon qubit device. The device 800 can comprise the first Josephson junction component 102 (JJ1), which can be located along a first current path 104 which can have a first current ($I_1$). The first current path 104 also can include the first inductive component 106, which can be associated with the first Josephson junction component 102. The first inductive component 106 can be or can comprise a first wire of a desired conductive material, wherein the first inductive component 106 can have a first level of inductance ($L_1$).

The device 800 also can comprise the second Josephson junction component 108 (JJ2) and third Josephson junction component 110 (JJ3), which can be coupled in series along the second current path 112 in parallel with the first current path 104, wherein the second current path 112 can have a second current ($I_2$), and wherein the second Josephson junction component 108 and third Josephson junction component 110 can facilitate controlling a frequency of the device 800, as more fully described herein. The second current path 112 also can include the second inductive component 114, which can be associated with the second Josephson junction component 108 and third Josephson junction component 110. The second inductive component 114 can be or can comprise a second wire of a desired conductive material, wherein the second inductive component 114 can have a second level of inductance ($L_2$).

The device 800 also can comprise the capacitor component 116, which can have the first terminal associated with the second Josephson junction component 108 and third Josephson junction component 110, and the second terminal associated with the ground 118 of the device 800. The device 800 further can include the current generator component 120, which can generate a desired current (e.g., a current pulse having a desired pulse form) having a desired current level.

In some embodiments, the first Josephson junction component 102 can be larger (e.g., 100 times larger, or more or less than 100 times larger) in area than each of the second Josephson junction component 108 and third Josephson junction component 110. A current splitting ratio between the first current path 104 and second current path 112 (e.g., $I_2/I_1$) can be increased based at least in part on the first Josephson junction component 102 being larger in area than the second Josephson junction component 108 and the third Josephson junction component 110. The frequency of the device 800 can be controlled based at least in part on an amount of current applied to the device 800 by the current generator component 120, the arrangement of the second Josephson junction component 108 and third Josephson junction component 110 in relation to the first Josephson junction component 102, and the size (e.g., area) of the first Josephson junction component 102 in relation to (e.g., as compared to) the sizes of the second Josephson junction component 108 and third Josephson junction component 110.

In certain embodiments, the device 800 can comprise a low pass filter component 802, the input of which can be associated with (e.g., connected to) the output of the current generator component 120, and the output of which can be associated with the first current path 104 and second current path 112 (e.g., the node in the circuit associated with the first current path 104 and second current path 112). In some embodiments, the low pass filter component 802 can be a 1.4 GHz low pass filter, although, in other embodiments, the low pass filter component 802 can be designed and constructed to be have a low pass cutoff frequency that is higher or lower than 1.4 GHz, as desired. The low pass filter component 802 can comprise a capacitor component 804 and an inductor component 806, wherein the inductor component 806 can be connected in series with and in between the current generator component 120 and the load (e.g., the Josephson junction components 102, 108, and 110, and capacitor component 116), and the capacitor component 804 can be in parallel with the current generator component 120 and the load, with a first terminal connected to the current generator component 120 and inductor component 806, and a second terminal connected to the ground 118. In an example embodiment, the capacitor component 804 can have a capacitance of 1.5 picofarads (pF), and the inductor component 806 can have an inductance of 8 nH, although, in other embodiments, the capacitor component 804 can have a capacitance that is greater than or less than 1.5 pF, and/or the inductor component 806 can have an inductance that is greater than or less than 8 nH, as desired.

In some embodiments, additionally or alternatively, the device 800 can comprise a current splitter component 808 that, at a first terminal, can be connected to the inductor component 806, the first current path 104, and second current path 112, and at its second terminal, can be connected to the ground 118. The current splitter component 808 can split (e.g., divide) the current that is going from the output of the low pass filter component 802 to the first current path 104 and second current path 112 to divert some of the current via the current splitter component 808 to the ground plane (e.g., the ground 118). In certain embodiments, the current splitter component 808 can comprise an inductor component that can have a desired inductance, such as, for example, 12 pH, another desired inductance that is greater than or less than 12 pH. In accordance with various embodiments, the current splitter component 808 can be on chip (e.g., integrated circuit (IC) chip) with the other components of the device 800, or the current splitter component 808 can be off chip (e.g., located on a separate IC chip from all or some of the other components of the device 800), but not lossy, so as not to introduce additional and undesirable noise to the device 800.

Figure 9:
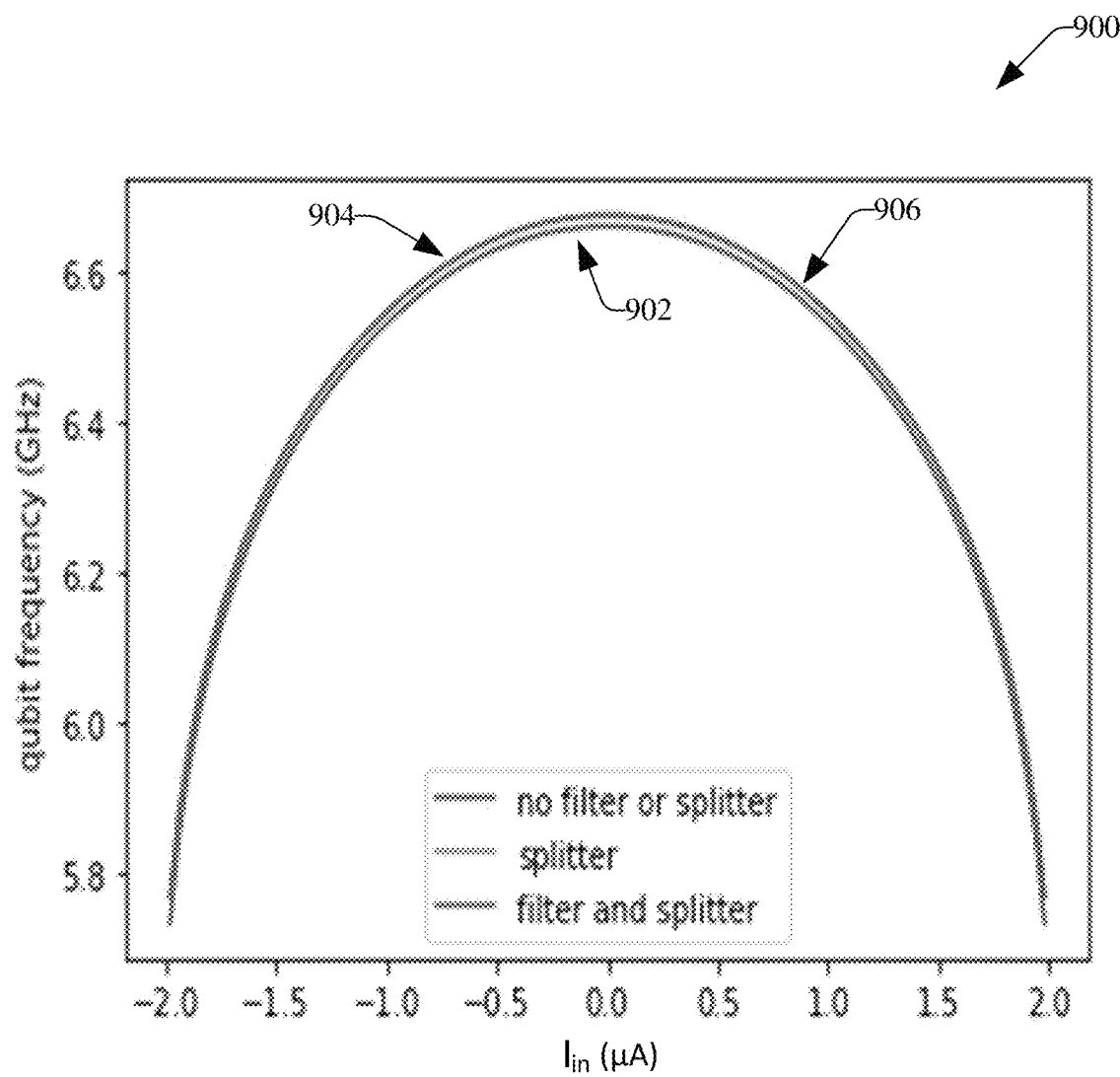
FIG. 9 presents a diagram of an example graph of the qubit frequency of the device as a function of input current, in various embodiments where the device includes a low pass filter component and current splitter component, includes only the current splitter component, or does not include the low pass filter component or the current splitter component.
Figure 10:
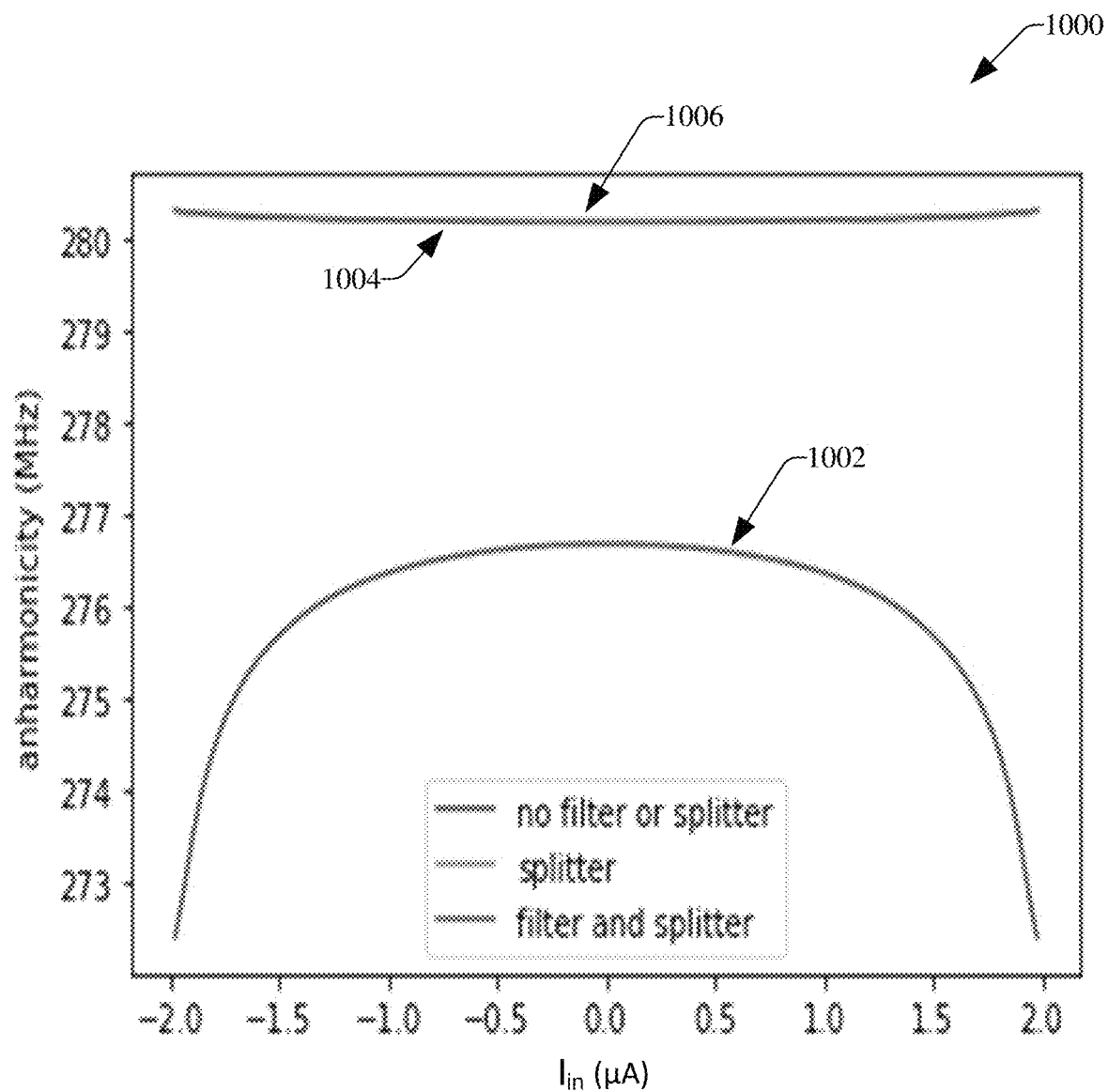
FIG. 10 presents a diagram of an example graph of the anharmonicity of the device as a function of input current, in various embodiments where the device includes the low pass filter component and current splitter component, includes only the current splitter component, or does not include the low pass filter component or the current splitter component.

Quantum circuit analyzer tool (QuCAT) modeling of the example device 800 can illustrate certain features of the device 800. QuCAT can be used to derive a Hamiltonian for the circuit of the device 800. The model of the circuit can include the low pass filter component and current splitter component, as described herein. Referring briefly to FIGS. 9 and 10 (along with FIG. 8), FIG. 9 presents a diagram of an example graph 900 of the qubit frequency of the example device 800 as a function of input (e.g., source) current ($I_{in}$), in various embodiments where the device includes the low pass filter component 802 and the current splitter component 808, includes only the current splitter component 808, or does not include the low pass filter component 802 or the current splitter component 808. FIG. 10 presents a diagram of an example graph 1000 of the anharmonicity (in megahertz (MHz)) of the example device 800 as a function of input current, in various embodiments where the device includes the low pass filter component 802 and the current splitter component 808, includes only the current splitter component 808, or does not include the low pass filter component 802 or the current splitter component 808.

With regard to the example graph 900 of FIG. 9, the graph 900 can comprise a plot 902 of the qubit frequency (in GHz) of the example device 800 as a function of the input current ($I_{in}$ in μA) when the device 800 does not include the low pass filter component 802 or the current splitter component 808. The graph 900 also can comprise a plot 904 of the qubit frequency of the example device 800 as a function of the input current when the device 800 includes both the low pass filter component 802 and the current splitter component 808. The graph 900 further can comprise a plot 906 of the qubit frequency of the example device 800 as a function of the input current when the device 800 includes only the current splitter component 808. (It is noted that plot 904 and plot 906 substantially overlap each other, so, as a result, plot 904 and plot 906 essentially appear as though they are a single line in the graph 900.) There can be desirably good agreement in qubit frequency versus source current to analytical modeling.

With regard to the example graph 1000 of FIG. 10, the graph 1000 can comprise a plot 1002 of the anharmonicity (in MHz) of the example device 800 as a function of the input current ($I_{in}$ in μA) when the device 800 does not include the low pass filter component 802 or the current splitter component 808. The graph 1000 also can comprise a plot 1004 of the anharmonicity of the example device 800 as a function of the input current when the device 800 includes both the low pass filter component 802 and the current splitter component 808. The graph 1000 further can comprise a plot 1006 of the anharmonicity of the example device 800 as a function of the input current when the device 800 includes only the current splitter component 808. (It is noted that plot 1004 and plot 1006 substantially overlap each other, so, as a result, plot 1004 and plot 1006 essentially appear as one line in the graph 1000.)

QuCAT modeling also can be utilized to examine current noise and Purcell loss with regard to qubit devices. Current noise in a qubit device can cause relaxation, which can be described by the fluctuation dissipation theorem and can be given by Equation (10) as follows:

$$\Gamma_1 = \frac{1}{T_1} = \frac{1}{\hbar^2}\left\langle 1\left|\frac{\partial H}{\partial I}\right|0\right\rangle^2 S_I(\omega_{01}).\quad\text{Eq. (10)}$$

To facilitate numerically evaluating, $$\frac{\partial H}{\partial I}$$

can be taken from QuCAT for relatively small changes in current. Using this for numerical evaluation, it can be found that $$\left\langle 1\left|\frac{\partial H}{\partial I}\right|0\right\rangle = 0,$$

so it can be observed that there is no current noise induced relaxation, and thus, current is not able to excite the qubit device.

Figure 11:
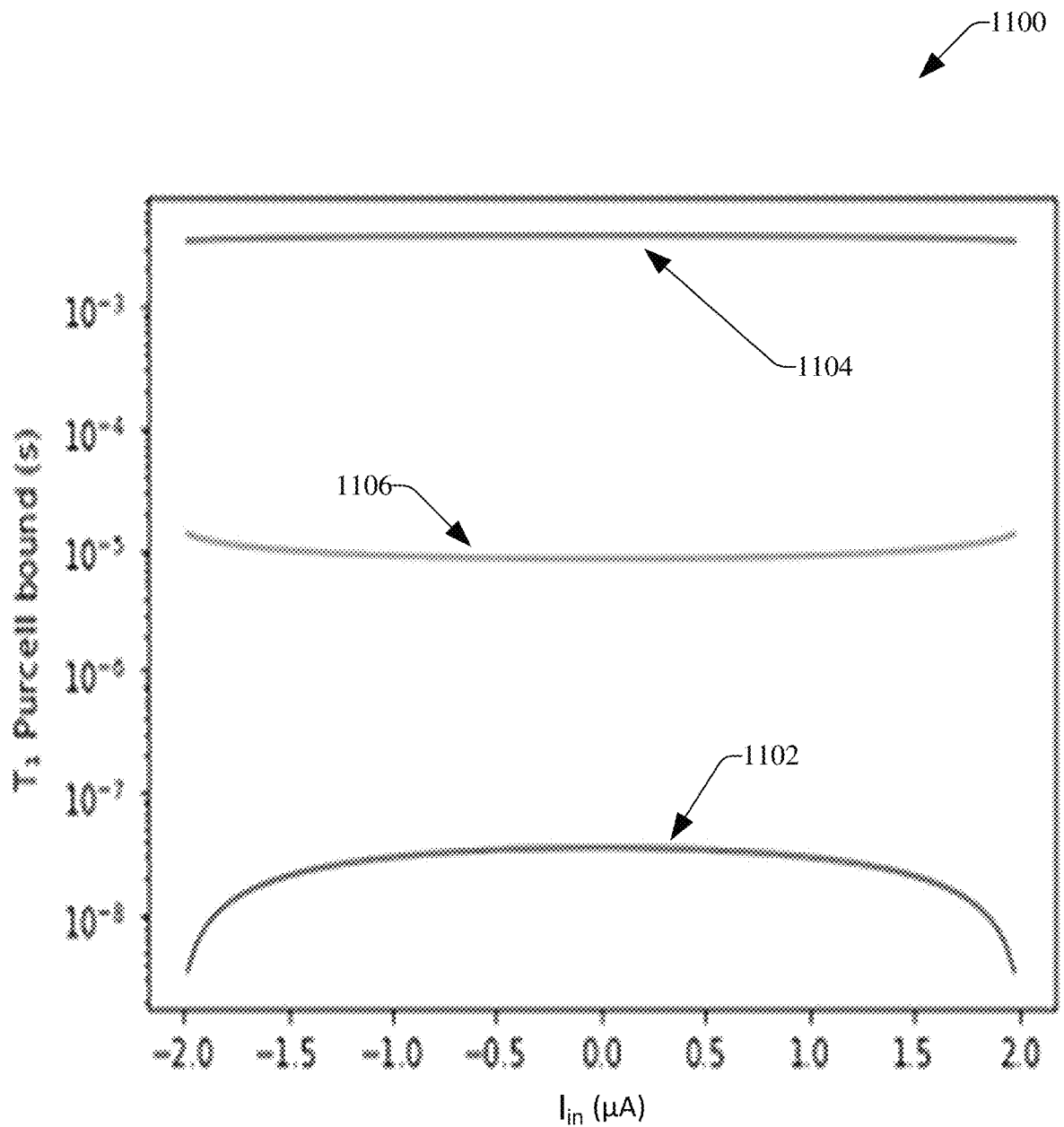
FIG. 11 presents a diagram of an example graph of the $T_1$ Purcell bound of the device as a function of input current, in various embodiments where the device includes the low pass filter component and current splitter component, includes only the current splitter component, or does not include the low pass filter component or current splitter component.

Purcell loss of a device, such as device 800 (e.g., qubit device), can be determined by admittance formalism or directly from QuCAT (e.g., for device with the low pass filter component and current splitter component, $T_1 > 3$ milliseconds (ms)). Referring briefly to FIG. 11 (along with FIG. 8), FIG. 11 presents a diagram of an example graph 1100 of the $T_1$ Purcell bound of the example device 800 as a function of input (e.g., source) current ($I_{in}$), in various embodiments where the device includes the low pass filter component 802 and the current splitter component 808, includes only the current splitter component 808, or does not include the low pass filter component 802 or the current splitter component 808. The graph 1100 can comprise a plot 1102 of the $T_1$ Purcell bound of the example device 800 as a function of the input current (in μA) when the device 800 does not include the low pass filter component 802 or the current splitter component 808. The graph 1100 also can comprise a plot 1104 of the $T_1$ Purcell bound of the example device 800 as a function of the input current when the device 800 includes both the low pass filter component 802 and the current splitter component 808. The graph 1100 further can comprise a plot 1106 of the $T_1$ Purcell bound of the example device 800 as a function of the input current when the device 800 includes only the current splitter component 808.

Johnson noise sensitivity of the device 800 also can be examined. Since only a relatively small amount of current (e.g., a few μA) typically will be utilized for frequency tuning of the device 800, as desired, additional attenuation can be added, as compared to a traditional qubit. Assuming an arbitrary waveform generator (AWG) that provides 5 volts (V) and approximately 100 mA, if and as desired, the device 800 can be attenuated by 100 decibels (dB) and still can have 10 μA available for frequency tuning.

If, for example, for the example device 800, there is 20 dB attenuation each on 4 K, 1 K, and 100 mK plates, the noise current can be 0.29 pA/√Hz (Johnson current noise), wherein K can be Kelvin temperature, wherein mK can be millikelvin, and wherein pA can be picoamps.

To facilitate examining sensitivity and power spectral density noise of a qubit device, the following equations, Equations 11, 12, and 13, for example, can be utilized as follows:

$$T_2^* = \frac{2}{D^2 S_I}, \quad \text{Eq. (11)}$$

$$D = \frac{\partial \omega}{\partial I}, \text{ and} \quad \text{Eq. (12)}$$

$$S_I = \frac{2k_b T}{R}, \quad \text{Eq. (13)}$$

wherein $T_2^*$ can be a desired frequency spot (e.g., sweet-spot frequency), D can be sensitivity for the device 800, and wherein $S_I$ can be the power spectral density noise for the device 800. For 10% detuning of a qubit device from a desired frequency spot (e.g., sweet-spot frequency), $T_2^*$=4.35 μs (for a current controlled device, such as device 800) and $T_2^*$=1455 μs for a magnetic field controlled device, such as a magnetic field-tuned transmon device), wherein μs can be microseconds.

If and as desired, in some embodiments, the sensitivity of the device 800 can be decreased through design and/or by adding a current splitter (e.g., current splitter component 808), such as described herein, which can divert a desired amount of the current to the ground plane. For example, diverting the current by a factor of 10 (e.g., through design and/or the current splitter component 808) in the device 800 can decrease the sensitivity D by 10 and the power spectral density noise $S_I$ by 100, which can give $T_2^*$=43.5 ms, while also providing desirable suppression of Purcell loss, such as described herein.

When examining changes in qubit frequency with respect to relatively small changes in flux, $T_2^*$ can be estimated as a function of input current with different amount of universal flux noise, for example, using Equation (14) as follows:

$$T_2^* = \frac{\hbar}{A} \left| \frac{\partial E_{01}}{\partial \Phi_{ext}} \right|^{-1}. \quad \text{Eq. (14)}$$

In certain embodiments, further improvement can be realized, for example, by making a relatively small perimeter loop with relatively wide wire segments connecting the Josephson junction (e.g., first, second, or third Josephson junction components 102, 108, or 110) and a relatively small hole to accept in the flux, which also can desirably make the qubit device (e.g., device 800) less sensitive to environment field as well.

Figure 12:
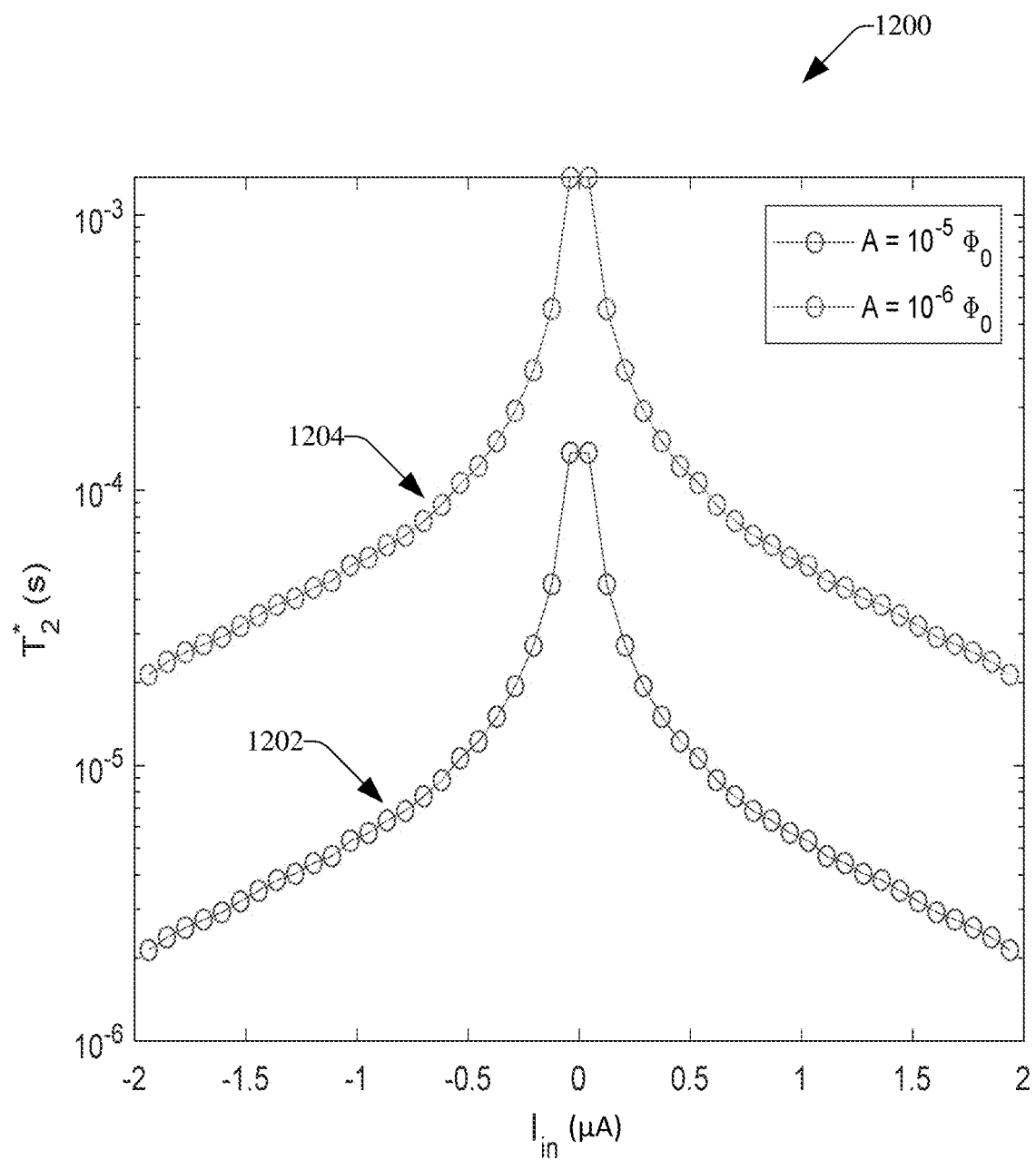
FIG. 12 presents a diagram of an example graph of desired frequencies $T_2^*$ of the device as a function of input current, in accordance with various aspects and embodiments of the disclosed subject matter.

Turning briefly to FIG. 12 (along with FIG. 8), FIG. 12 presents a diagram of an example graph 1200 of desired frequencies (e.g., a sweet-spot frequency or other desired frequency) $T_2^*$ of the example device 800 as a function of input (e.g., source) current ($I_{in}$), in accordance with various aspects and embodiments of the disclosed subject matter. The graph 1200 can comprise a plot 1202 of a desired frequencies (e.g., a sweet-spot frequency or other desired frequency) $T_2^*$ (in seconds (s)) of the example device 800 as a function of the input current (in μA) when A=$10^{-5}\Phi_0$. The graph 1200 can comprise a plot 1204 of desired frequencies (e.g., a sweet-spot frequency or other desired frequency) $T_2^*$ of the example device 800 as a function of the input current (in μA) when A=$10^{-6}\Phi_0$.

In accordance with various embodiments of the disclosed subject matter, the flux noise sensitivity and mutual inductance of a qubit device (e.g., device 100, or device 800) can be desirably reduced by geometry of the components of the device. Since the qubit device does not require magnetic field tuning, or sufficiently large mutual inductance, the geometry of the qubit device can be modified to have a relatively small (e.g., a very small) mutual inductance and also reduced sensitivity to flux noise.

Figure 13:
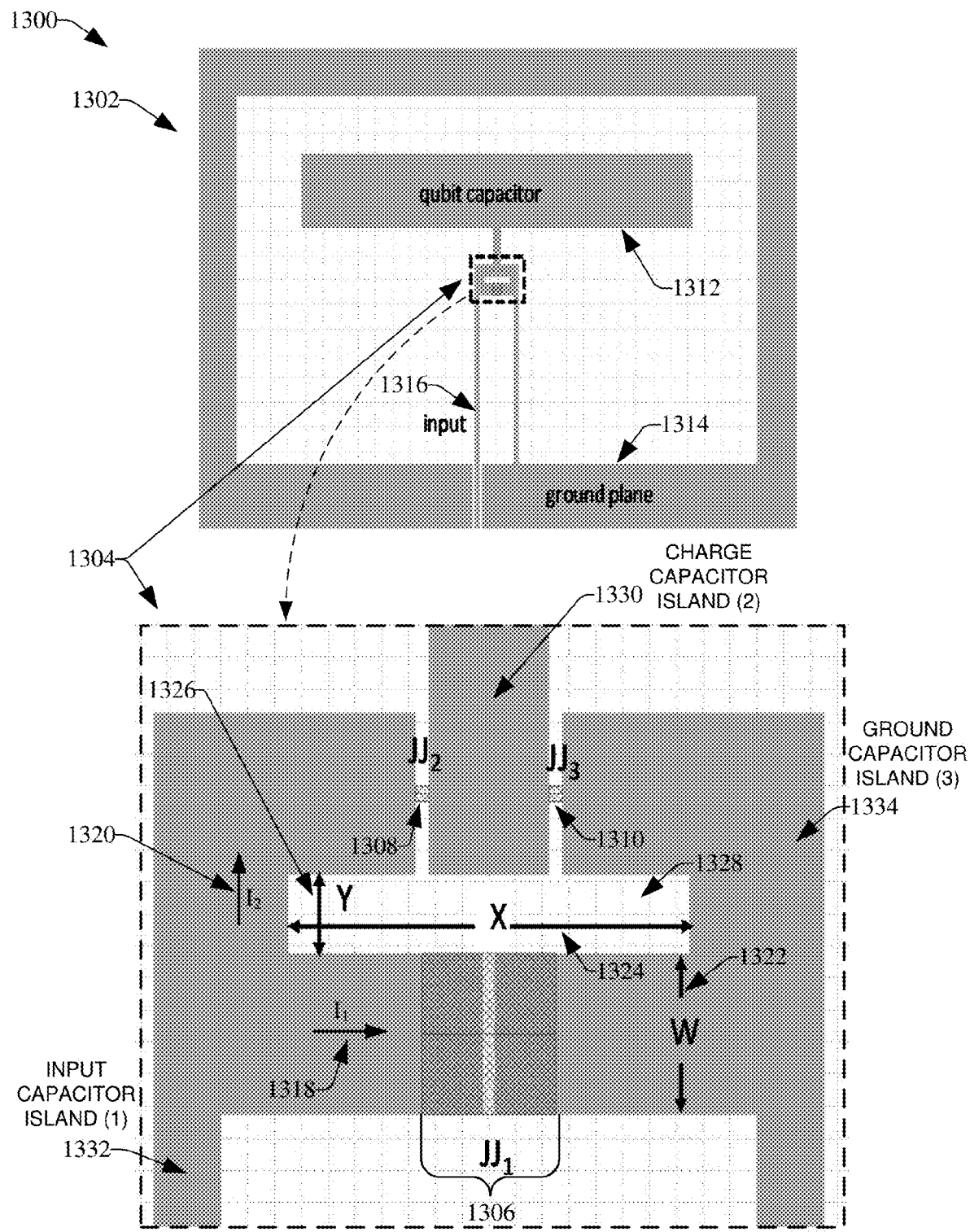
FIG. 13 illustrates a diagram of an example device that can be utilized to provide desirable current biased frequency tuning, and can have its geometry desirably modified to have a desirably small mutual inductance and also a desirably reduced sensitivity to noise, in accordance with various aspects and embodiments of the disclosed subject matter.

Turning to FIG. 13, FIG. 13 illustrates a diagram of an example device 1300 that can be utilized to provide desirable (e.g., enhanced, suitable, acceptable, or optimal) current biased frequency tuning, and can have its geometry desirably modified to have a desirably small mutual inductance and also a desirably reduced sensitivity to noise (e.g., flux and/or other noise), in accordance with various aspects and embodiments of the disclosed subject matter. The example device 1300 can be, for example, a current biased qubit device. In some embodiments, the example device 1300 can be a current biased transmon qubit device. The device 1300 is illustrated with a first view 1302 of the device 1300 and a second view 1304 (e.g., an exploded or magnified view) of a portion of the device 1300 that comprises the Josephson junctions.

The device 1300 can comprise a first Josephson junction component 1306 (JJ1), a second Josephson junction component 1308 (JJ2), third Josephson junction component 1310 (JJ3), capacitor component 1312 (e.g., qubit capacitor), ground plane 1314 (e.g., the ground), and input 1316. The respective components (e.g., 1306, 1308, 1310, 1312, 1314, and 1316) can be arranged in a circuit in relation to each other, such as described herein, for example, with regard to device 100 of FIG. 1. For example, the first Josephson junction component 1306 can be located along a first current path 1318 which can have a first current ($I_1$) (e.g., when current is applied via the input 1316, for example, by a current generator component). The first current path 104 also can include a first inductive component (not explicitly shown in FIG. 13) that can be associated with the first Josephson junction component 1306. The first inductive component can be or can comprise a first wire of a desired conductive material, wherein the first inductive component can have a first level of inductance ($L_1$). The second Josephson junction component 1308 and third Josephson junction component 1310 can be coupled in series along a second current path 1320 that can be in parallel with the first current path 1318, wherein the second current path 1320 can have a second current ($I_2$). The second current path 1320 can include a second inductive component (not explicitly shown in FIG. 13) that can be associated with the second Josephson junction component 1308 and third Josephson junction component 1310. The second inductive component can be or can comprise a second wire of a desired conductive material, wherein the second inductive component can have a second level of inductance ($L_2$). The capacitor component 1312 can have a first terminal associated with (e.g., connected with the second current path 1320 between) the second Josephson junction component 1308 and third Josephson junction component 1310, and a second terminal that can be associated with (e.g., connected to) the ground plane 1314.

The geometrical features of the device 1300 can include the width 1322 (W) of the first current path 1318 (e.g., the first wire of the first current path 1318) and first Josephson junction component 1306, and the dimensions X 1324 and Y 1326 of the space 1328 defined by (e.g., surrounded by) the first current path 1318, second current path 1320, first Josephson junction component 1306, second Josephson junction component 1308, third Josephson junction component 1310, and the pad 1330 associated with the capacitor component 1312 (e.g., pad or capacitor charge island that can connect to the capacitor component 1312).

In accordance with various embodiments of the disclosed subject matter, the width 1322 (W) of the first current path 1318 and associated first Josephson junction component 1306 and/or the dimensions X 1324 and/or Y 1326 of the space 1328 (e.g., the space of the circuit loop of the device 1300) can be designed, modified, or adjusted to enable the device 1300 to have a desirably small (e.g., very small) mutual inductance (e.g., reduced mutual inductance) and/or to also have a desirably reduced sensitivity to flux noise.

In that regard, it can be useful to examine certain geometry design points relating to flux noise. Mathematical relationships between flux, flux noise, dimension W 1322, and dimensions X 1324 and Y 1326 of the space 1328 can be given, for example, by example Equation (15) as follows:

$$\langle \Phi^2 \rangle = \frac{2\mu_0^2 m^2 \sigma (X/W + Y/W + 2)}{3\pi} \left( \frac{\ln\left(\frac{2bW}{\lambda^2}\right)}{2\pi} + \frac{e-1}{2\pi} \right) = 2A_{\Phi_0} \ln 2, \quad \text{Eq. (15)}$$

wherein m=$\mu_b$ (Bohr magneton), ø=$10^{16}$ m$^{-2}$ (surface spin density), λ=40 nm, and b=120 nm (thickness).

Figure 14:
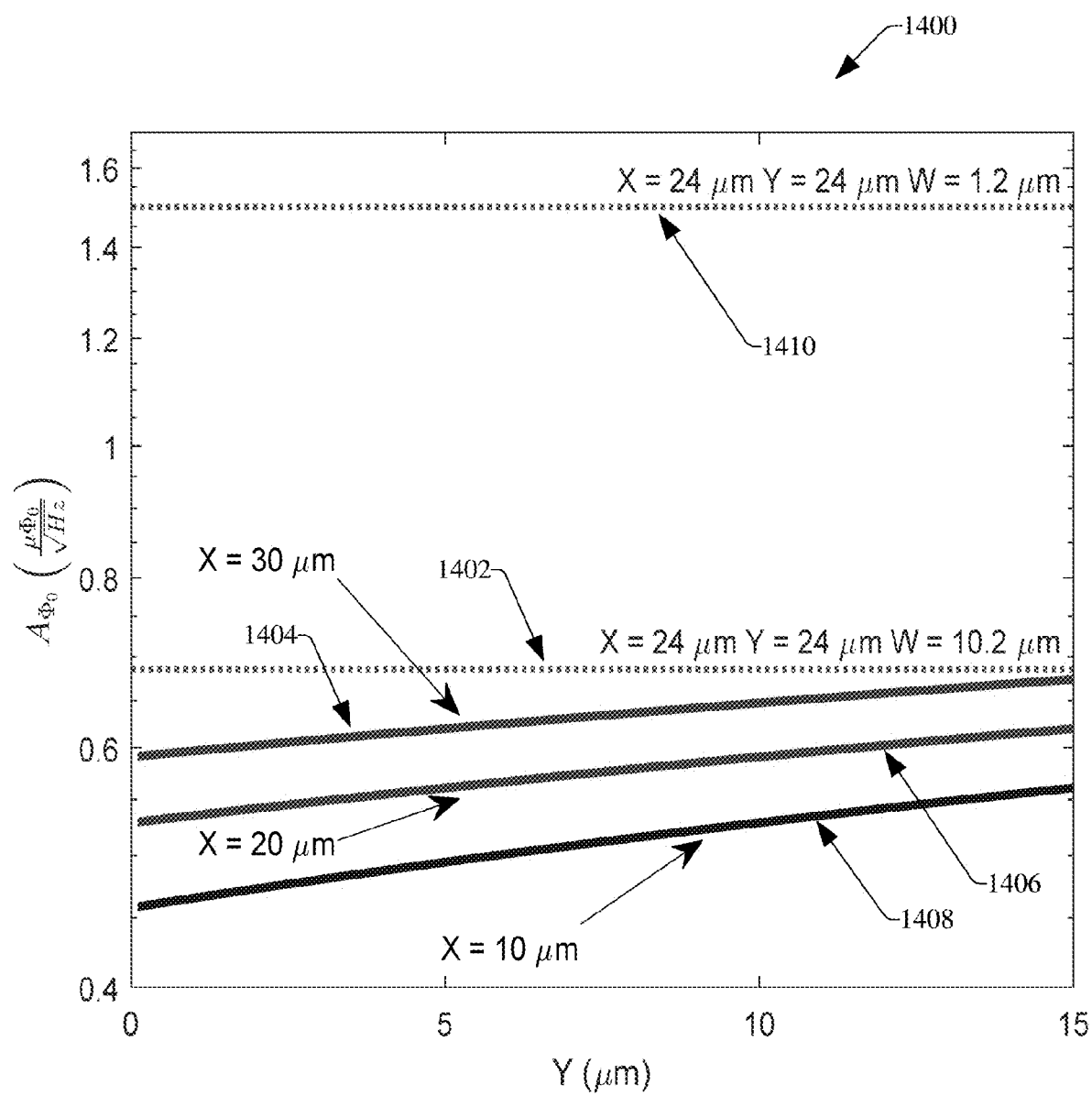
FIG. 14 presents a diagram of an example graph of flux noise of a device (e.g., current biased frequency tunable device) as a function of dimension Y of a space of a circuit loop of the device, for various dimensional values of dimension X of the space of the circuit loop and width of first current path of the device, in accordance with various aspects and embodiments of the disclosed subject matter.

In that regard, referring briefly to FIG. 14 (along with FIG. 13), FIG. 14 presents a diagram of an example graph 1400 of flux noise of a device as a function of dimension Y 1326 of the space 1328 (e.g., dimension Y of a circuit loop of the device), for various dimensional values of dimension X 1324 of the space 1328 (e.g., dimension X of the circuit loop of the device) and dimension W 1322 (e.g., width of first current path of the device), in accordance with various aspects and embodiments of the disclosed subject matter. The example graph 1400 can comprise a plot 1402 of flux noise ($A_{\Phi_0}$ ($\mu\Phi_0/\sqrt{Hz}$)) of the device (e.g., device 1300) when X=24 micrometers (μm), Y=24 μm, and W=10.2 μm. The example graph 1400 can comprise a plot 1404 of flux noise as a function dimension Y 1326 when X=30 μm and W=10.2 μm for the device (e.g., device 1300). The example graph 1400 also can include a plot 1406 of flux noise as a function dimension Y 1326 when X=20 μm and W=10.2 μm, and a plot 1408 of flux noise as a function dimension Y 1326 when X=10 μm and W=10.2 μm, for the device (e.g., device 1300). The example graph 1400 further can comprise a plot 1410 of flux noise when X=24 μm, Y=24 μm, and W=1.2 μm with regard to a traditional magnetic field-based qubit or coupler device.

As can be observed from the graph 1400, the flux noise of the example device 1300 can be significantly lower than the flux noise of a traditional qubit device. As also can be observed from the graph 1400, the flux noise of the device 1300 can be modified (e.g., reduced) by modifying (e.g., reducing (or increasing) in size) the dimensions X 1324 and/or Y 1326 of the space 1328 of the device 1300 and/or the dimension W 1322 of the device 1300. For instance, as dimension X 1324 of the space 1328 is decreased in size, the flux noise of the device 1300 can decrease, and as dimension Y 1326 of the space 1328 is decreased in size (and/or the dimension W 1322 is increased in size), the flux noise of the device 1300 can decrease.

There can be certain limitations on design geometry with regard to the design of a qubit device. For instance, one limitation on sizing for more favorable (e.g., improved or increased) flux noise reduction (e.g., smaller loop size and larger width) of a qubit device can be cross-capacitance, such as, for example, cross-capacitance between the input charge island (1) 1332 and capacitor charge island (2) 1330 (e.g., pad 1330), cross-capacitance between the input charge island (1) 1332 and ground charge island (3) 1334, and cross-capacitance between the capacitor charge island (2) 1330 and ground charge island (3) 1334. This can be limited by the capacitance not changing the resonant frequency of the Josephson junctions (e.g., first, second, and/or third Josephson junction components 1306, 1308, and/or 1310).

Figure 15:
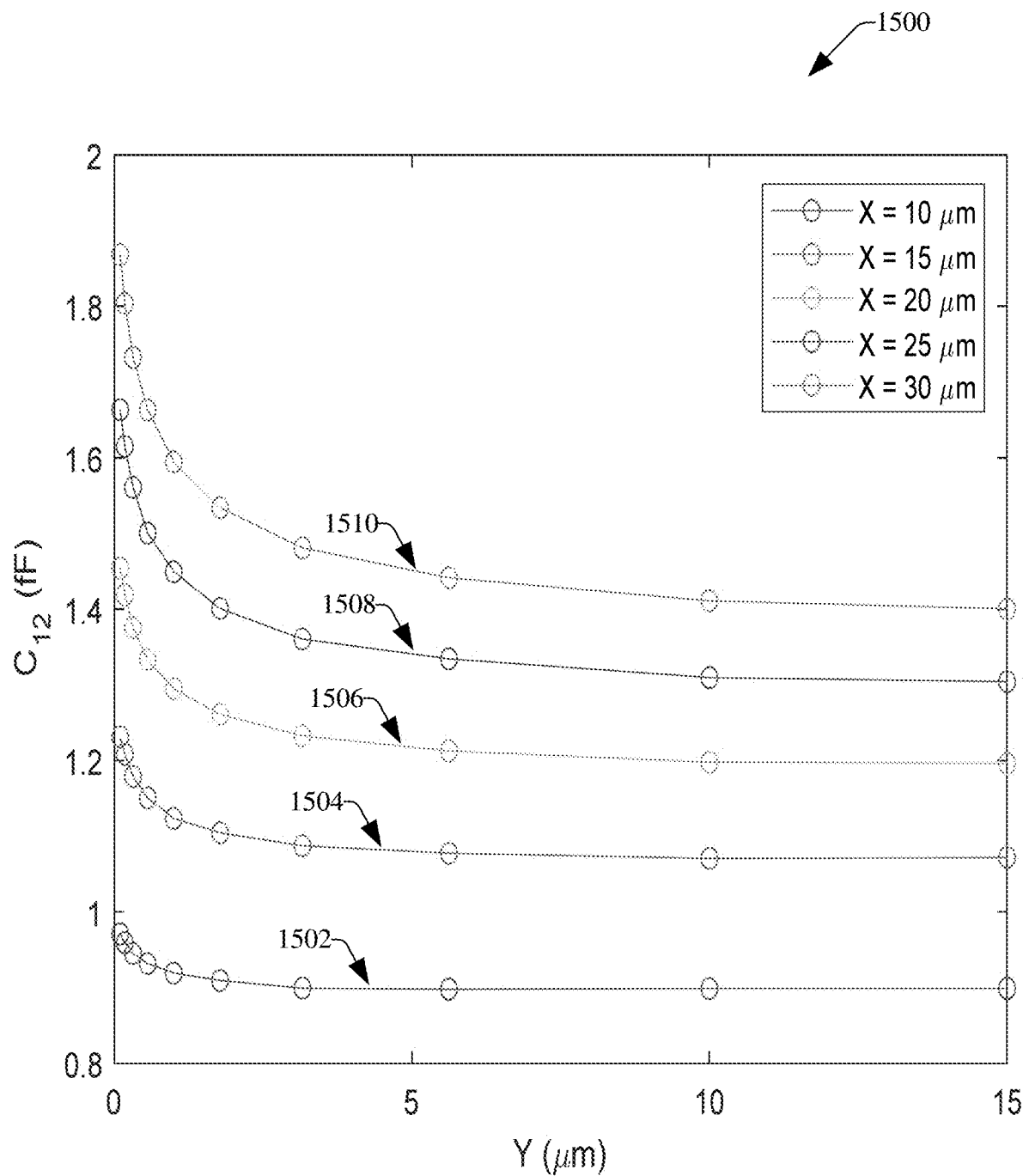
FIGS. 15-17 present diagrams of example graphs of respective simulations of cross-capacitance between an input charge island, capacitor charge island, and ground charge island of the example device, for various dimensions X and Y of the space of the device, in accordance with various aspects and embodiments of the disclosed subject matter.
Figure 16:
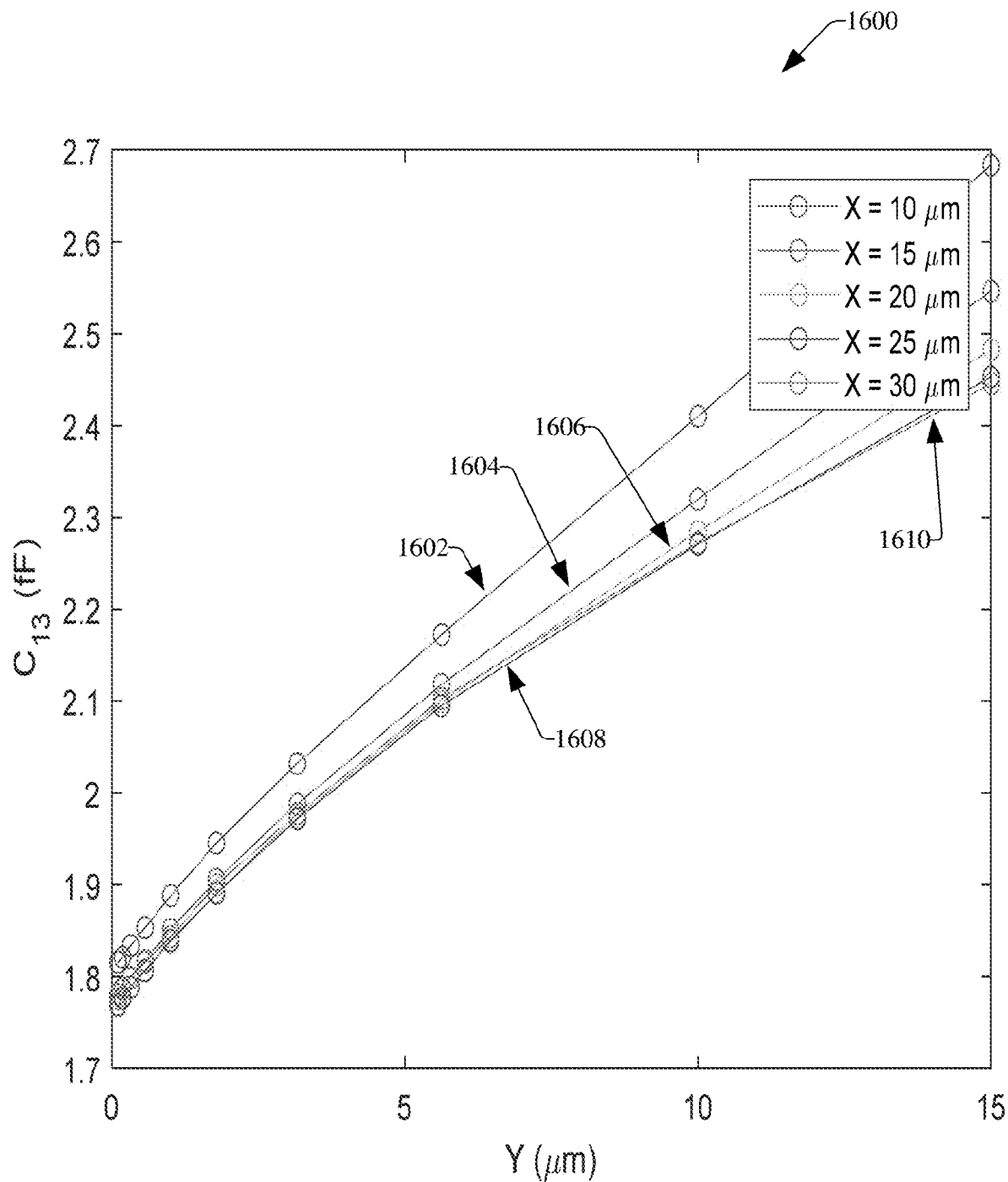
Figure 17:
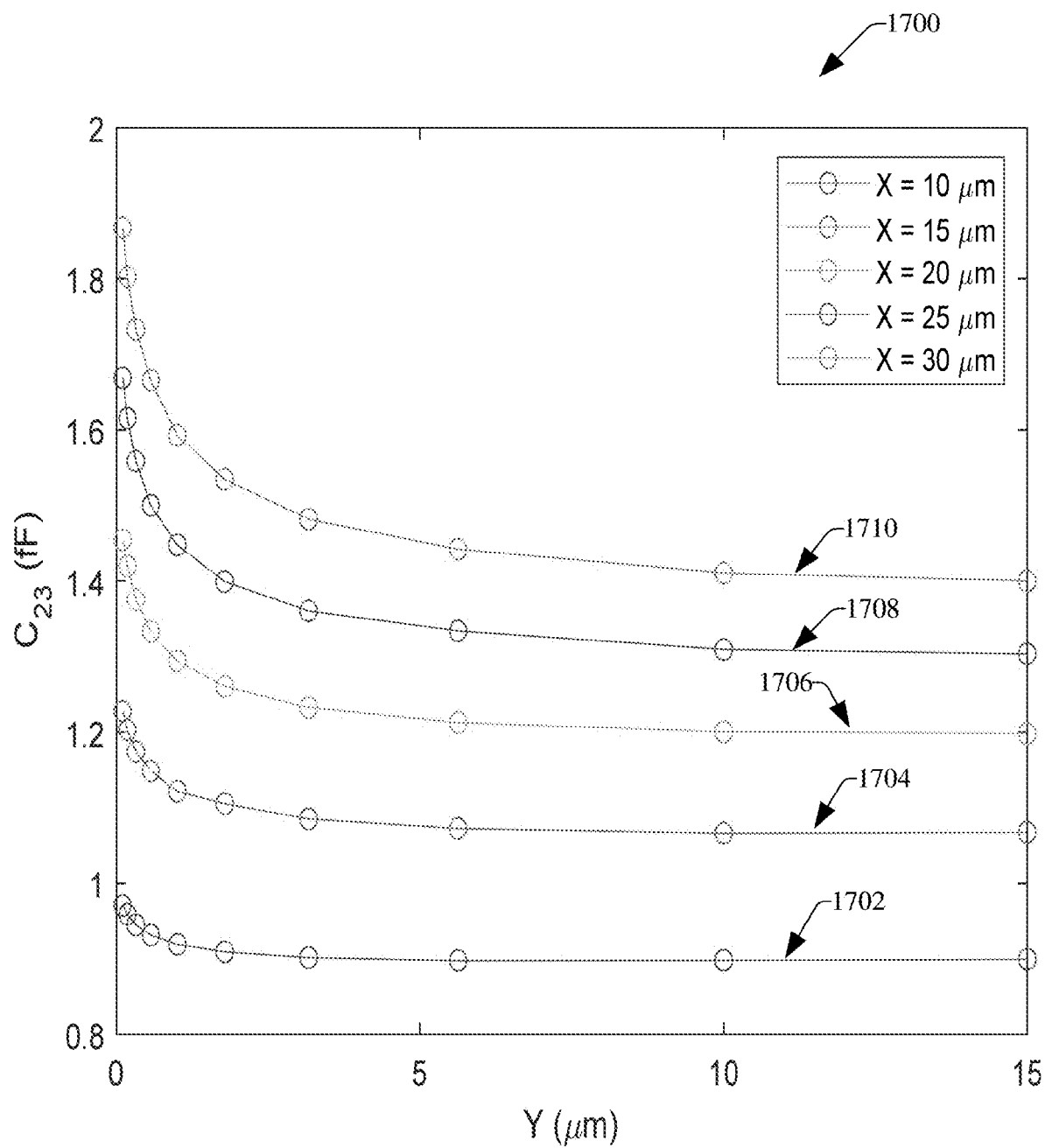

Simulations with Q3D can enable determining cross-capacitance between the input charge island (1) 1332, capacitor charge island (2) 1330, and the ground charge island (3) 1334. In that regard, referring briefly to FIGS. 15-17 (along with FIG. 13), FIGS. 15-17 present diagrams of example graphs of respective simulations of cross-capacitance between the input charge island (1) 1332, capacitor charge island (2) 1330, and the ground charge island (3) 1334, for various dimensions X and Y of the space 1328 of the device, in accordance with various aspects and embodiments of the disclosed subject matter. FIG. 15 depicts a diagram of an example graph 1500 of respective simulations of cross-capacitance between the input charge island (1) 1332 and the capacitor charge island (2) 1330 as a function of dimension Y for various sizes of dimension X of the space 1328 of the device, in accordance with various aspects and embodiments of the disclosed subject matter. The example graph 1500 can comprise a plot 1502 of cross-capacitance between the input charge island (1) 1332 and the capacitor charge island (2) 1330 ($C_{12}$) (in fF) as a function of dimension Y for dimension X=10 μm. The example graph 1500 also can comprise a plot 1504 of cross-capacitance $C_{12}$ as a function of dimension Y for dimension X=15 μm, a plot 1506 of cross-capacitance $C_{12}$ as a function of dimension Y for dimension X=20 μm, a plot 1508 of cross-capacitance $C_{12}$ as a function of dimension Y for dimension X=25 μm, and a plot 1510 of cross-capacitance $C_{12}$ as a function of dimension Y for dimension X=30 μm.

FIG. 16 illustrates a diagram of an example graph 1600 of respective simulations of cross-capacitance between the input charge island (1) 1332 and the ground charge island (3) 1334 as a function of dimension Y for various sizes of dimension X of the space 1328 of the device, in accordance with various aspects and embodiments of the disclosed subject matter. The example graph 1600 can comprise a plot 1602 of cross-capacitance between the input charge island (1) 1332 and the ground charge island (3) 1334 ($C_{13}$) (in fF) as a function of dimension Y for dimension X=10 μm. The example graph 1600 also can comprise a plot 1604 of cross-capacitance $C_{13}$ as a function of dimension Y for dimension X=15 μm, a plot 1606 of cross-capacitance $C_{13}$ as a function of dimension Y for dimension X=20 μm, a plot 1608 of cross-capacitance $C_{13}$ as a function of dimension Y for dimension X=25 μm, and a plot 1610 of cross-capacitance $C_{13}$ as a function of dimension Y for dimension X=30 μm.

FIG. 17 presents a diagram of an example graph 1700 of respective simulations of cross-capacitance between the capacitor charge island (2) 1330 and the ground charge island (3) 1334 as a function of dimension Y for various sizes of dimension X of the space 1328 of the device, in accordance with various aspects and embodiments of the disclosed subject matter. The example graph 1700 can comprise a plot 1702 of cross-capacitance between the capacitor charge island (2) 1330 and the ground charge island (3) 1334 ($C_{23}$) (in fF) as a function of dimension Y for dimension X=10 μm. The example graph 1700 also can comprise a plot 1704 of cross-capacitance $C_{23}$ as a function of dimension Y for dimension X=15 μm, a plot 1706 of cross-capacitance $C_{23}$ as a function of dimension Y for dimension X=20 μm, a plot 1708 of cross-capacitance $C_{23}$ as a function of dimension Y for dimension X=25 μm, and a plot 1710 of cross-capacitance $C_{23}$ as a function of dimension Y for dimension X=30 μm.

Figure 18:
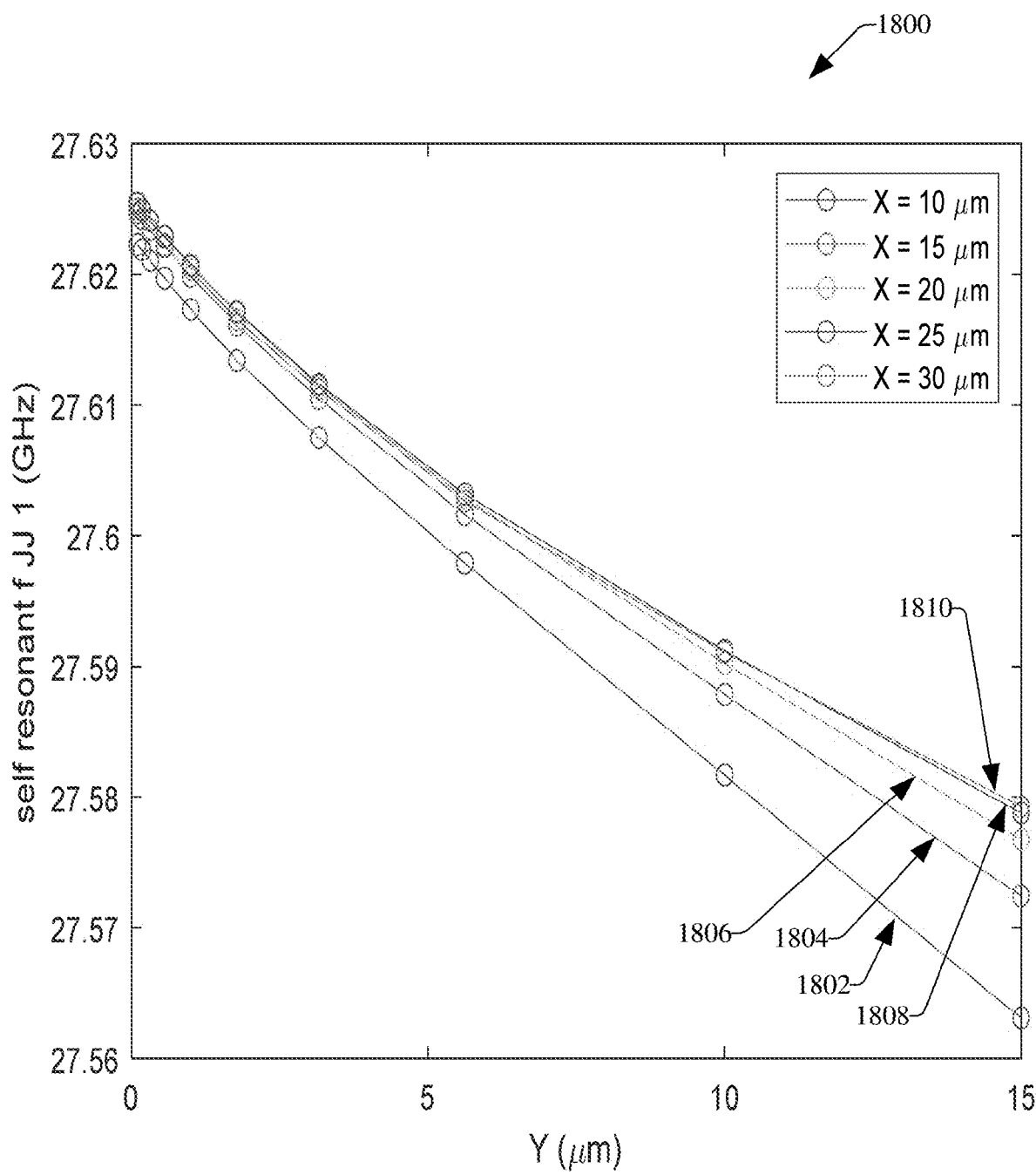
FIGS. 18-20 present diagrams of example graphs of respective simulations of self resonant frequencies from respective Josephson junction components as a function of dimension Y for various dimension X sizes of the space of the device, in accordance with various aspects and embodiments of the disclosed subject matter.
Figure 19:
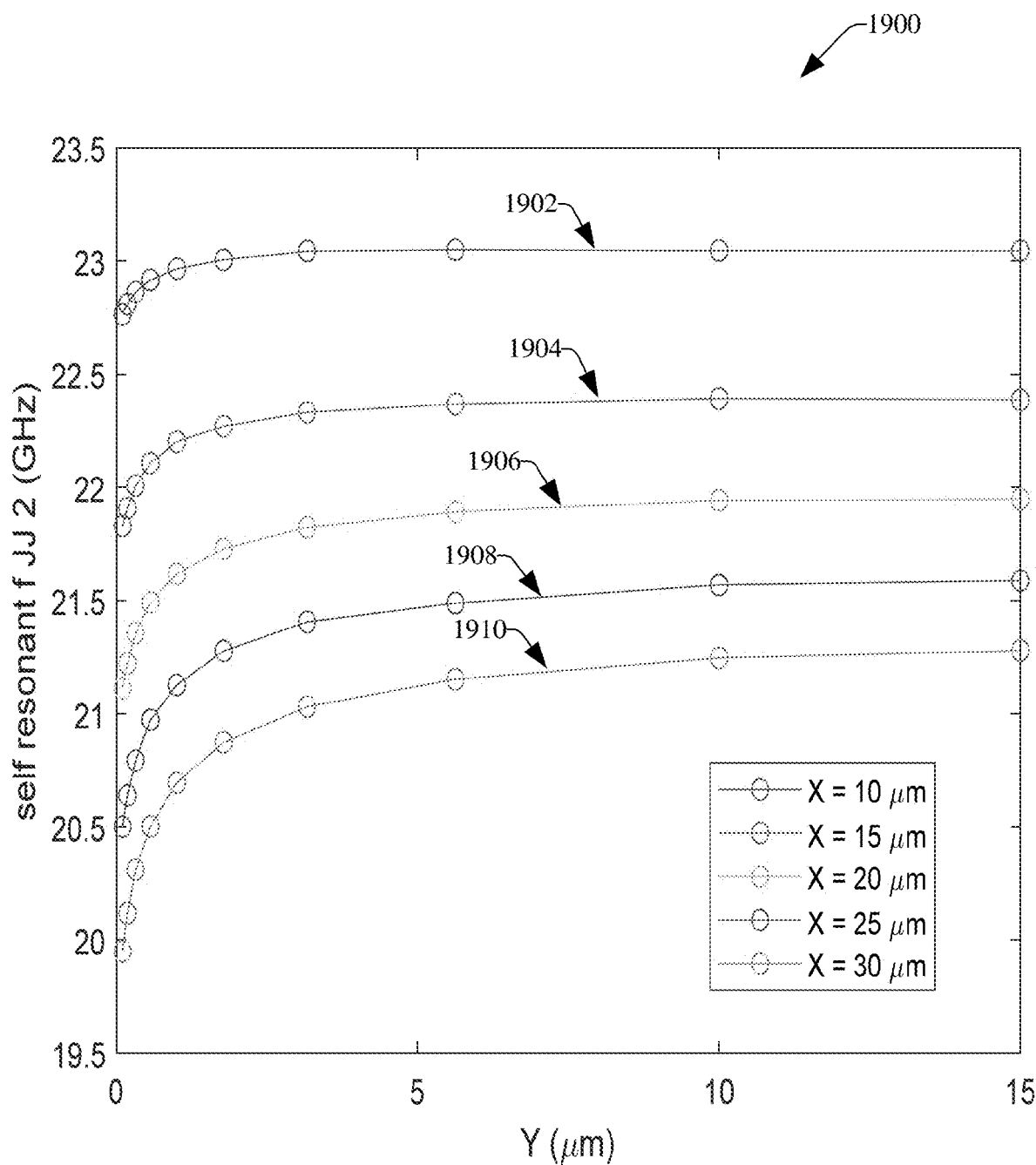
Figure 20:
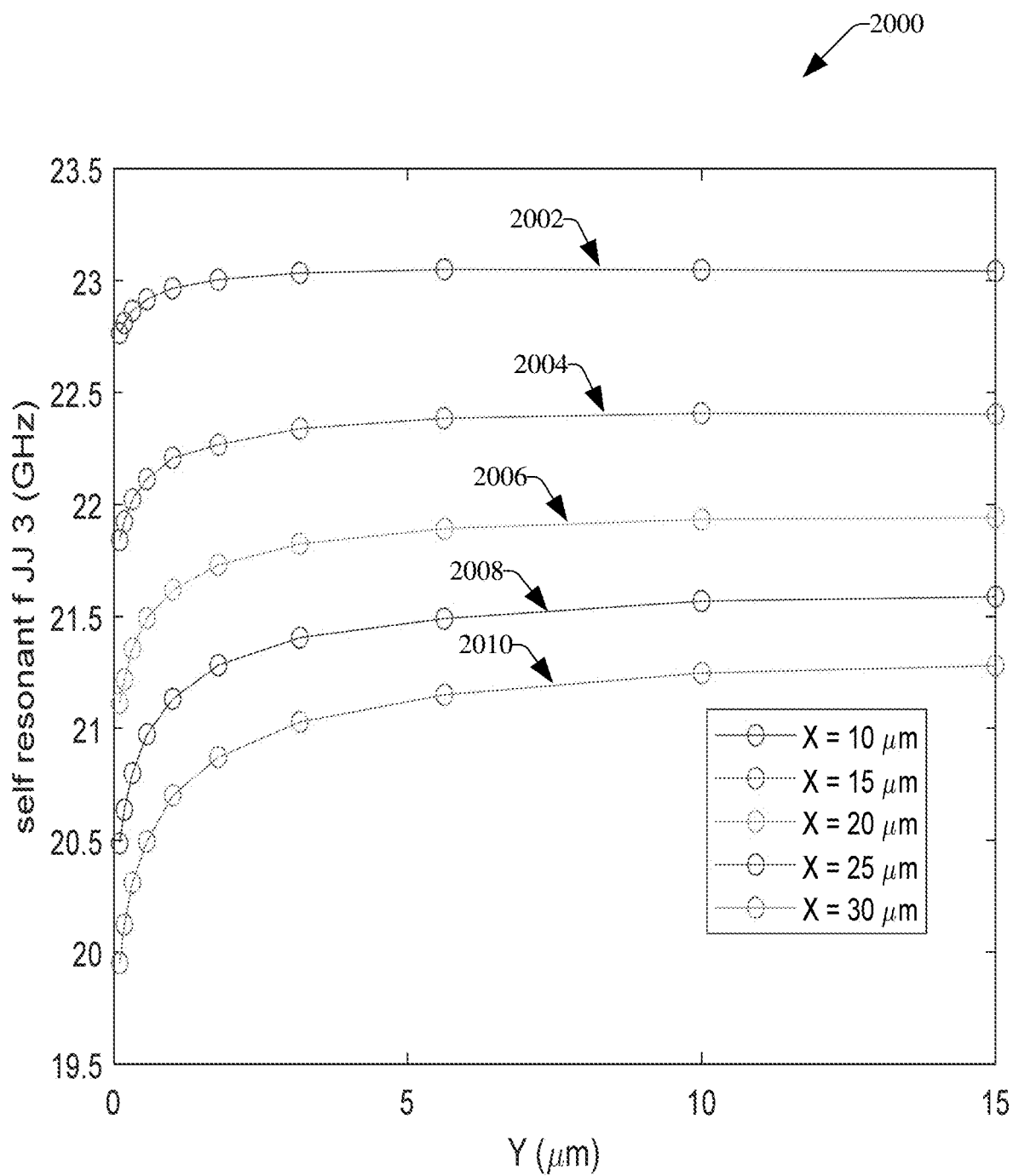

Simulations of self resonant frequencies from respective Josephson junction components due to cross-capacitance ranging from X=30 μm and Y=15 μm down to X=10 μm and Y=0.1 μm also can be performed and examined. Even when scaling the X and Y dimensions in the range of X=30 μm and Y=15 μm down to X=10 μm and Y=0.1 μm, in the following graphs in FIGS. 18-20, it can be observed that the resulting self resonant frequencies from respective Josephson junction components due to cross-capacitance can still be acceptable for qubit devices, as the self resonant frequencies typically can be at or above approximately 20 GHz. With regard to FIGS. 18-20 (along with FIG. 13), FIGS. 18-20 present diagrams of example graphs of respective simulations of self resonant frequencies from respective Josephson junction components as a function of dimension Y for various dimension X sizes of the space 1328 of the device, in accordance with various aspects and embodiments of the disclosed subject matter. FIG. 18 illustrates a diagram of an example graph 1800 of simulations of self resonant frequencies from the first Josephson junction component 1306 (JJ1) as a function of dimension Y for various sizes of dimension X of the space 1328 of the device, in accordance with various aspects and embodiments of the disclosed subject matter. The example graph 1800 can comprise a plot 1802 of self resonant frequencies from JJ1 as a function of dimension Y for dimension X=m, a plot 1804 of self resonant frequencies from JJ1 as a function of dimension Y when dimension X=15 μm, a plot 1806 of self resonant frequencies from JJ1 as a function of dimension Y when dimension X=20 μm, a plot 1808 of self resonant frequencies from JJ1 as a function of dimension Y when dimension X=25 μm, and a plot 1810 of self resonant frequencies from JJ1 as a function of dimension Y when dimension X=30 μm.

FIG. 19 presents a diagram of an example graph 1900 of simulations of self resonant frequencies from the second Josephson junction component 1308 (JJ2) as a function of dimension Y for various sizes of dimension X of the space 1328 of the device, in accordance with various aspects and embodiments of the disclosed subject matter. The example graph 1900 can comprise a plot 1902 of self resonant frequencies from JJ2 as a function of dimension Y when dimension X=10 μm, a plot 1904 of self resonant frequencies from JJ2 as a function of dimension Y when dimension X=15 μm, a plot 1906 of self resonant frequencies from JJ2 as a function of dimension Y when dimension X=20 μm, a plot 1908 of self resonant frequencies from JJ2 as a function of dimension Y when dimension X=25 μm, and a plot 1910 of self resonant frequencies from JJ2 as a function of dimension Y when dimension X=30 μm.

FIG. 20 depicts a diagram of an example graph 2000 of simulations of self resonant frequencies from the third Josephson junction component 1310 (JJ3) as a function of dimension Y for various sizes of dimension X of the space 1328 of the device, in accordance with various aspects and embodiments of the disclosed subject matter. The example graph 2000 can comprise a plot 2002 of self resonant frequencies from JJ3 as a function of dimension Y when dimension X=10 μm, a plot 2004 of self resonant frequencies from JJ3 as a function of dimension Y when dimension X=15 μm, a plot 2006 of self resonant frequencies from JJ3 as a function of dimension Y when dimension X=20 μm, a plot 2008 of self resonant frequencies from JJ3 as a function of dimension Y when dimension X=25 μm, and a plot 2010 of self resonant frequencies from JJ3 as a function of dimension Y when dimension X=30 μm.

Figure 21:
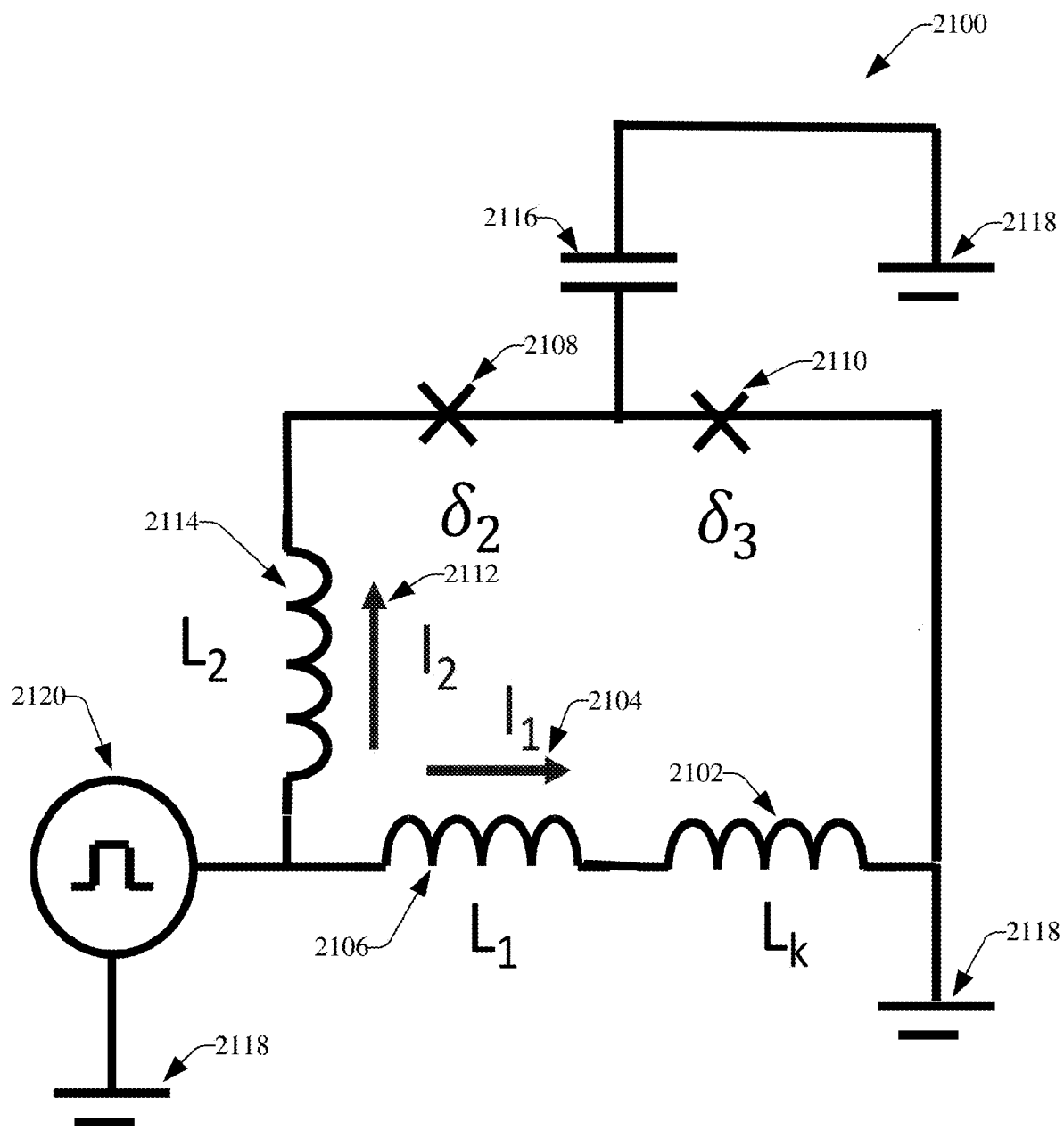
FIG. 21 illustrates a diagram of an example, non-limiting device that can employ a high kinetic inductance wire along with Josephson junctions to facilitate desirable current biased frequency tuning, in accordance with various aspects and embodiments of the disclosed subject matter.

Turning to FIG. 21, FIG. 21 illustrates a diagram of an example, non-limiting device 2100 that can employ a high kinetic inductance wire along with Josephson junctions to facilitate desirable (e.g., enhanced, suitable, acceptable, or optimal) current biased frequency tuning, in accordance with various aspects and embodiments of the disclosed subject matter. In some embodiments, the Josephson junction of the first current path (e.g., first Josephson junction component 102 of device 100) can be replaced with a high kinetic inductance wire formed of a desired high kinetic inductance material. In some embodiments, the device 2100 can be a qubit device (e.g., a current biased frequency tunable qubit device), such as, for example, a transmon qubit device.

The device 2100 can comprise a high kinetic inductance wire 2102 that can be located along a first current path 2104 which can have a first current ($I_1$) (e.g., when current is supplied to the device 2100). The high kinetic inductance wire 2102 can have an inductance ($L_k$), which can be based at least in part on how high the high kinetic inductance of the wire 2102 is and the dimensions of the high kinetic inductance wire 2102. The high kinetic inductance wire 2102 can have a kinetic inductance level that satisfies (e.g., that is sufficiently high enough; that meets or exceeds) a defined threshold kinetic inductance level, wherein the defined threshold kinetic inductance level can indicate whether the wire 2102 has a kinetic inductance level that is high enough to considered high kinetic inductance wire. In some embodiments, the defined threshold kinetic inductance level can be 1 nH/μm, although it is to be appreciated and understood that, in other embodiments, the defined threshold kinetic inductance level can be greater than or less than 1 nH/μm. In some embodiments, the high kinetic inductance wire 2102 can be formed of a desired superconducting material (e.g., niobium nitride, niobium titanium nitride, or other desired superconducting material) that satisfies the defined threshold kinetic inductance level. The first current path 2104 also can include a first inductive component 2106 that can be associated with the high kinetic inductance wire 2102. The first inductive component 106 can be or can comprise a first wire of a desired conductive material (or can be part of the high kinetic inductance wire 2102), wherein the first inductive component 2106 can have a first level of inductance ($L_1$). The first level of inductance of the first inductive component 2106 can be relatively small (e.g., very small or negligible) as compared to the amount of inductance for the high kinetic inductance wire 2102.

The device 2100 also can comprise a first Josephson junction component 2108 (identified as JJ2 in FIG. 21) and second Josephson junction component 2110 (identified as JJ3 in FIG. 21) that can be coupled in series along a second current path 2112 in parallel with the first current path 2104, wherein the second current path 2112 can have a second current ($I_2$) (e.g., when current is supplied to the device 2100), and wherein the first Josephson junction component 2108 and second Josephson junction component 2110 can facilitate controlling a frequency of the device 2100, as more fully described herein. The second current path 2112 also can include a second inductive component 2114 that can be associated with the first Josephson junction component 2108 and second Josephson junction component 2110. The second inductive component 2114 can be or can comprise a second wire of a desired conductive material, wherein the second inductive component 2114 can have a second level of inductance ($L_2$). The first level of inductance of the first inductive component 2106 can comprise, for example, self inductance or effective inductance of the first inductive component 2106 (e.g., self inductance or effective inductance of the first wire), and the second level of inductance of the second inductive component 2114 can comprise, for example, self inductance or effective inductance of the second inductive component 2114 (e.g., self inductance or effective inductance of the second wire).

The device 2100 also can comprise a capacitor component 2116 (e.g., a capacitor) that can have a first terminal associated with (e.g., connected with the second current path 2112 between) the first Josephson junction component 2108 and second Josephson junction component 2110, and a second terminal that can be associated with (e.g., connected to) the ground 2118 of the device 2100. In one non-limiting example, the capacitor component 2116 can be 65 fF, although a capacitor of another desired capacitance greater than or less than 65 fF can be utilized in the device 2100, as desired or appropriate. The device 2100 also can include a current generator component 2120 that can generate a desired current (e.g., a current pulse having a desired pulse form) having a desired current level, wherein the current can be supplied or applied to the first current path 2104 and the second current path 2112.

A current splitting ratio between the first current path 2104 and second current path 2112 (e.g., $I_2/I_1$) can be determined or modified (e.g., increased (or decreased)) based at least in part on the characteristics (e.g., the high kinetic inductance) of the high kinetic inductance wire 2102 in relation to the area of the first Josephson junction component 2108 and the area of the second Josephson junction component 2110. The frequency of the device 2100 can be controlled (e.g., managed, adjusted, modified, or tuned) based at least in part on an amount of current applied to the device 2100 by the current generator component 2120, the amount of kinetic inductance of the high kinetic inductance wire 2102, the sizes (e.g., areas) of the first Josephson junction component 2108 and second Josephson junction component 2110, and/or the arrangement of the high kinetic inductance wire 2102 in relation to the first Josephson junction component 2108 and second Josephson junction component 2110.

The analysis of the device 2100 of FIG. 21 having the high kinetic inductance wire 2102 having inductance ($L_k$) in device 2100 (in place of the first Josephson junction component 102 of the device 100 of FIG. 1) can be relatively similar to the analysis of the device 100 of FIG. 1, as described herein, except that there can be a difference in the analysis that can include, for example, the phase difference across the high kinetic inductance wire 2102, and kinetic inductance does not have an associated magnetic flux contribution (e.g., similar to the first Josephson junction component 102 of device 100).

Due to the condition of single valued-ness of phase δ, as accounted for in Equation (16):

$$-\frac{2\pi L_k I_1}{\Phi_0} + \delta_2 + \delta_3 = \qquad \text{Eq. (16)}$$

$$\frac{\pi(\Phi_T)}{\Phi_0} + 2n\pi = \frac{2\pi(\mathcal{L}_1 I_1 - \mathcal{L}_2 I_2 + \Phi_{ext})}{\Phi_0} + 2n\pi,$$

wherein $$\frac{2\pi L_k I_1}{\Phi_0}$$

can represent the phase of the high kinetic inductance wire 2102, $\delta_2$ can represent the phase of the first Josephson junction component 2108, $\delta_3$ can represent the phase of the second Josephson junction component 2110, and $\Phi_{ext}$ can represent external flux.

With Josephson junction current relations (assuming below critical current) and KCL, proceeding from Equation (16), in Equation (17), it can follow that:

$$-\frac{2\pi L_k(I_{in} - I_2)}{\Phi_0} + \sin^{-1}\left(\frac{I_2}{I_{c2}}\right) + \sin^{-1}\left(\frac{I_2}{I_{c3}}\right) = \qquad \text{Eq. (17)}$$

$$\frac{2\pi(\mathcal{L}_1(I_{in} - I_2) - \mathcal{L}_2 I_2 + \Phi_{ext})}{\Phi_0} + 2n\pi,$$

wherein $I_{in}$ can be the input (e.g., source) current that can be provided by the current generator component 2120. From Equation (17), $I_{C2}$ can be solved for numerically and/or graphically for different $I_{in}$ values.

Figure 22:
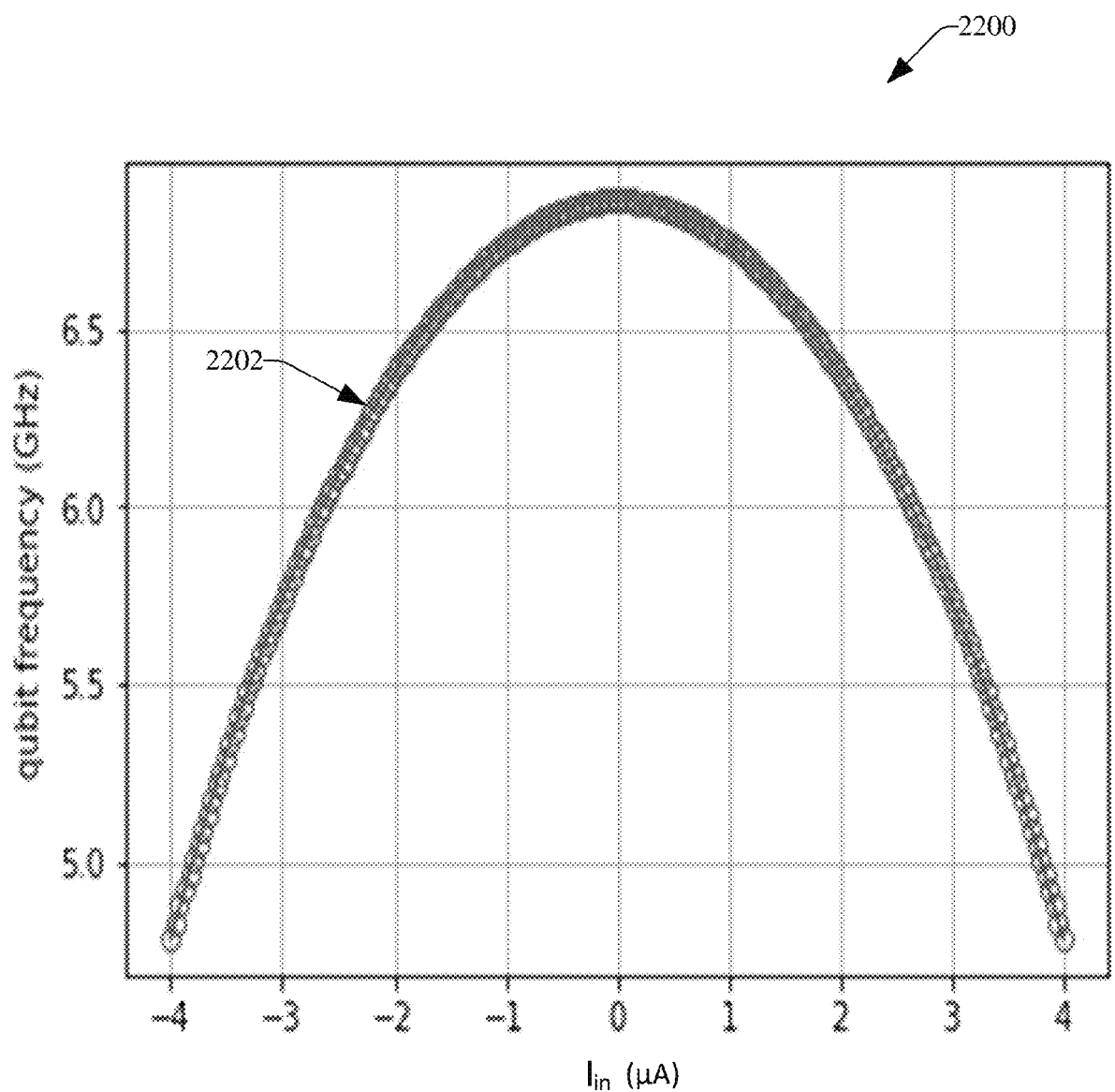
FIG. 22 depicts a diagram of an example graph of frequency (e.g., qubit frequency) of the device as a function of current, in accordance with various aspects and embodiments of the disclosed subject matter.

Referring briefly to FIG. 22 (along with FIG. 21), FIG. 22 depicts a diagram of an example graph 2200 of frequency (e.g., qubit frequency) of the device 2100 as a function of current, $I_{in}$, in accordance with various aspects and embodiments of the disclosed subject matter. In a non-limiting example, the current $I_{C2}$ associated with the first Josephson junction component 2108 can be 20 nanoamps (nA) and the current $I_{C3}$ associated with the second Josephson junction component 2110 can be 20 nA. The current $I_{in}$-$I_2$ associated with the high kinetic inductance wire 2102 can be 2000 nA. The capacitance of the capacitor component 2116 can be 65 fF. The inductance levels of the first level of inductance ($L_1$) and the second level of inductance ($L_2$) each can be 12 pH. With the high kinetic inductance wire 2102 having a high kinetic inductance and being arranged in relation to the first Josephson junction component 2108 and the second Josephson junction component 2110, as described herein, the high kinetic inductance wire 2102 can facilitate (e.g., can enable) a desirable increase in the current splitting ratio ($I_2/I_1$), which can provide for a desirable current biasing effect of the first Josephson junction component 2108 and the second Josephson junction component 2110. For instance, t the high kinetic inductance wire 2102 can desirably be utilized to increase the current splitting ratio ($I_2/I_1$), and most of the tuning effect (e.g., current biased tuning effect) of the device 2100 can be due in part to (e.g., can occur in) the first Josephson junction component 2108 and second Josephson junction component 2110.

In the graph 2200 of FIG. 22, from the plot 2202 of the frequency (in GHz) as a function of current (in µA) for the device 2100, it can be observed that, for 10% tuning from a desired frequency spot (e.g., a sweet-spot frequency, such as approximately 6.9 GHz at 0.0 µA), the device 100 (e.g., current biased qubit device) can involve the use of only approximately 2.3 µA. In contrast, a typical field-based device (e.g., a magnetic field-based Xmon-coupler device) can require significantly more current (e.g., up to 34 µA) in order to achieve 10% tuning from a desired frequency spot (e.g., a sweet-spot frequency). As also can be observed, the plot 2202 of FIG. 22 with regard to the device 2100 having the high kinetic inductance wire 2102 in the first current path 2104 can be substantially similar to the plot 202 of FIG. 2 with regard to the device 100 having the first Josephson junction component 102 in the first current path 104.

In some embodiments, although not shown in FIG. 21, the device 2100 can include a low pass filter component (e.g., low pass filter component 802) and/or a current splitter component (e.g., current splitter component 808), same as or similar to as described with regard to device 800 of FIG. 8, to facilitate reducing undesired sensitivity of the device 2100 to noise (e.g., current noise, flux noise, or Johnson noise) and/or Purcell loss. In certain embodiments, the device 2100 also can have its geometry (e.g., dimensions W, X, and/or Y) designed or modified (e.g., adjusted), same as or similar to as described with regard to device 1300 of FIG. 13 to facilitate reducing noise sensitivity and/or mutual inductance of the device 2100.

Notably and desirably, the device 2100, which can be a current controlled frequency tunable device, and can utilize a high kinetic inductance wire 2102 and two Josephson junctions (e.g., first and second Josephson junction components 2108 and 2110) as arranged in the circuitry of the device 2100, can use the applied current (e.g., supplied from the current generator component 2120) through a Josephson junction to change the inductance of the Josephson junction or through the high kinetic inductance wire to change the inductance of the high kinetic inductance wire.

Traditional tunable qubit or coupler devices, however, use a magnetic field generated from a current line to tune the qubit frequency. In such traditional tunable qubit or coupler devices, the magnetic field (e.g., flux threaded through a SQUID loop) can change the difference in the Josephson junction phases, and hence, Josephson junction inductance, and can thus allow a change in qubit frequency. The disclosed subject matter, including the device 2100 (e.g., current controlled frequency tunable device), does not have to use a magnetic field generated from a current line in order to tune the qubit frequency, as the disclosed subject matter (e.g., device 2100) can utilize the applied current (e.g., supplied from the current generator component 2120) through a Josephson junction (e.g., first or second Josephson junction component 2108 or 2110) to change the inductance of the Josephson junction, or through the high kinetic inductance wire to change the inductance of the high kinetic inductance wire, and facilitate enabling desirable tuning of the frequency of the device, such as more fully described herein.

The devices (e.g., device 100, device 800, device 1300, and device 2100), which can be current biased frequency tunable qubit devices, such as described herein, can be desirably enhanced and reliable frequency or flux tunable devices, which can have desirably fast tunable gates and tunable qubits to facilitate avoiding undesired frequency collisions and dispersive interactions (e.g., ZZ interactions), and also can mitigate, reduce, or minimize magnetic crosstalk and flux noise, which can be desirable, since magnetic crosstalk and flux noise can undesirably limit gate fidelity of qubit devices. The devices (e.g., device 100, device 800, device 1300, and device 2100) also can be a useful tool for design of tunable elements in addition to the flux-based scheme.

The devices (e.g., device 100, device 800, device 1300, and device 2100) described herein can be utilized in multi-qubit systems that use flux controlled tunable elements (e.g., couplers or qubits). The devices (e.g., device 100, device 800, device 1300, and device 2100) also can aid in reducing power dissipation (e.g., heating) in cables or attenuators as the number of qubits are scaled up in qubit-based systems. With the desirably low (e.g., very low) currents utilized in the devices (e.g., device 100, device 800, device 1300, and device 2100) described herein, the current biased schemes (e.g., designs) and techniques of the disclosed subject matter, as described herein with regard to such devices, also can reduce the complexity associated with having to satisfy or comply with applicable requirements or constraints (e.g., design constraints) for low temperature electronics and hardware being designed to drive and control flux tunable qubits. The devices (e.g., device 100, device 800, device 1300, and device 2100) and the current biased schemes (e.g., designs) and techniques, such as described herein, can be adopted (e.g., can be suitable or desirable for adoption) in the fields of quantum circuitry and computing as a desirable technique for achieving frequency tunability of qubits.

The systems and/or devices have been (or will be) described herein with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 23:
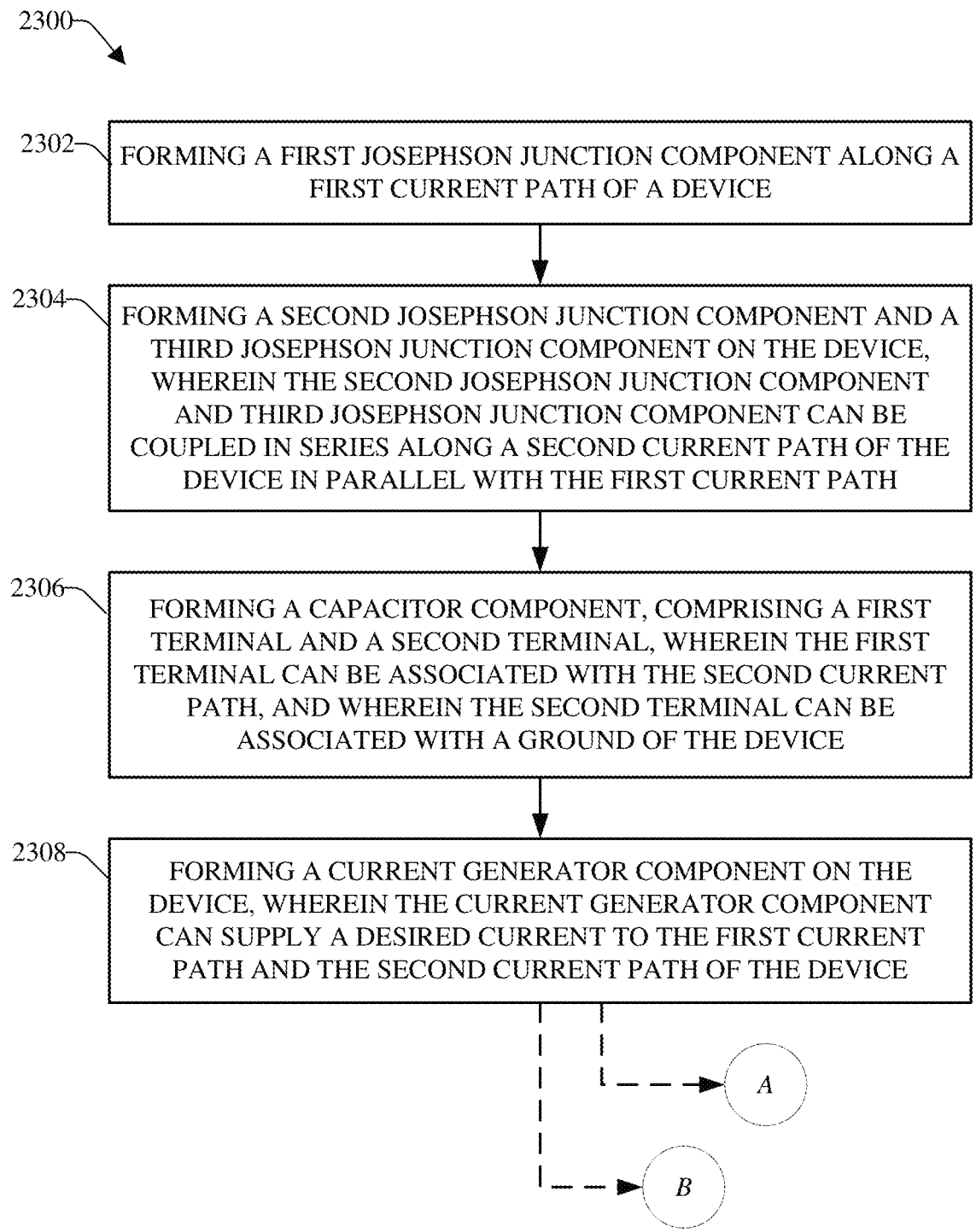
FIG. 23 illustrates a flow diagram of an example, non-limiting method for forming a device that can be utilized to provide desirable current biased frequency tuning, in accordance with various aspects and embodiments of the disclosed subject matter.

FIG. 23 illustrates a flow diagram of an example, non-limiting method 2300 for forming a device that can be utilized to provide desirable (e.g., enhanced, suitable, acceptable, or optimal) current biased frequency tuning, in accordance with various aspects and embodiments of the disclosed subject matter. The method 2300 can be performed by, for example, a system (e.g., computer system) comprising or operatively coupled to a processor component and a memory. Repetitive description of like elements employed in other embodiments described herein is or may be omitted for sake of brevity.

At 2302, a first Josephson junction component can be formed along a first current path of a device. At 2304, a second Josephson junction component and a third Josephson junction component can be formed on the device, wherein the second Josephson junction component and third Josephson junction component can be coupled in series along a second current path of the device in parallel with the first current path. For instance, the system can form the first Josephson junction component along the first current path, and can form the second Josephson junction component and third Josephson junction component that can be coupled in series along the second current path in parallel with the first current path of the device. The first current path can be associated with a first inductive component having a first inductance, and the second current path can be associated with a second inductive component having a second inductance.

At 2306, a capacitor component, comprising a first terminal and a second terminal, can be formed, wherein the first terminal can be associated with the second current path, and wherein the second terminal can be associated with a ground of the device. The capacitor component (e.g., capacitor) can have a desired amount of capacitance, such as described herein. In some embodiments, the system can form or place the capacitor component on the device, and can connect the first terminal to the second current path, for example, between the second Josephson junction component and the third Josephson junction component, and can connect the second terminal to the ground.

At 2308, a current generator component can be formed on the device, wherein the current generator component can supply a desired current to the first current path and the second current path of the device. In certain embodiments, the system can form or place (e.g., insert) the current generator component on the device, wherein an output of the current generator component can be associated with (e.g., directly or indirectly connected to) the first current path and second current path of the device.

Figure 24:
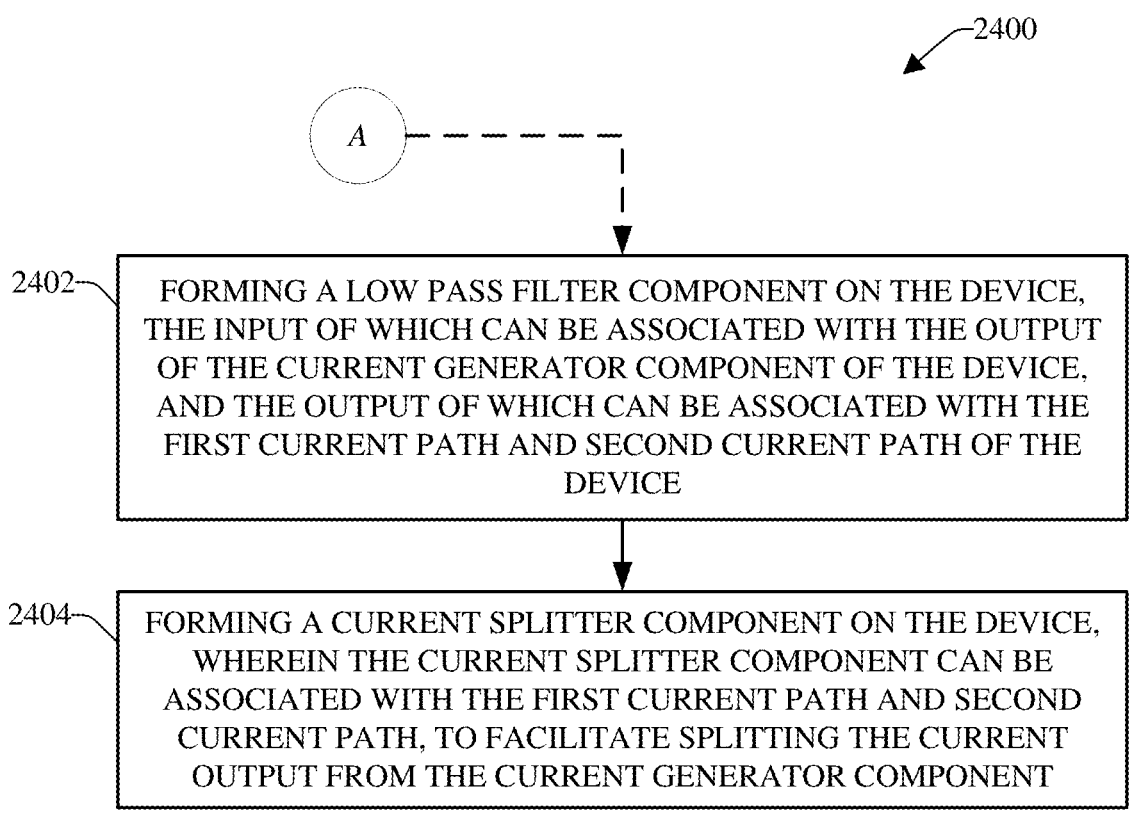
FIG. 24 depicts a flow diagram of an example, non-limiting method for forming a low pass filter component and/or current splitter component on a device that can be utilized to provide desirable current biased frequency tuning, to facilitate reducing sensitivity of the device to noise and Purcell loss, in accordance with various aspects and embodiments of the disclosed subject matter.

In some embodiments, the method 2300 can proceed to reference point A, wherein the method 2400 of FIG. 24 can proceed from reference point A. In certain embodiments, the method 2300 can proceed to reference point B, wherein the method 2500 of FIG. 25 can proceed from reference point B.

FIG. 24 depicts a flow diagram of an example, non-limiting method 2400 for forming a low pass filter component and/or current splitter component on a device that can be utilized to provide desirable (e.g., enhanced, suitable, acceptable, or optimal) current biased frequency tuning, to facilitate reducing the sensitivity of the device to noise (e.g., flux and/or other noise) and Purcell loss, in accordance with various aspects and embodiments of the disclosed subject matter. The method 2300 can be performed by, for example, a system (e.g., computer system) comprising or operatively coupled to a processor component and a memory. Repetitive description of like elements employed in other embodiments described herein is or may be omitted for sake of brevity. In some embodiments, the method 2400 can proceed from reference point A of method 2300 of FIG. 23.

At 2402, a low pass filter component can be formed on the device, the input of which can be associated with the output of the current generator component of the device, and the output of which can be associated with the first current path and second current path of the device. The system can form or place (e.g., insert) the low pass filter component on the device, wherein the input (e.g., input port) of the low pass filter component can be associated with (e.g., connected to) the output of the current generator component, and the output of the low pass filter component can be associated with the first current path and second current path of the device (e.g., the node in the circuit associated with the first current path and second current path). The low pass filter component can be structured, and can comprise components (e.g., inductor component and capacitor component), such as more fully described herein.

At 2404, a current splitter component can be formed on the device, wherein the current splitter component can be associated with the first current path and second current path, to facilitate splitting the current output from the current generator component. In some embodiments, additionally or alternatively (e.g., in addition to or alternative to the low pass filter component), the system can form or place the current splitter component on the device such that the current splitter component can be associated with the first current path and second current path, to facilitate splitting the current output from the current generator component (e.g., diverting some of the current to the ground plane of the device). For instance, the system can connect a first terminal of the current splitter component to the first current path, the second current path, and/or the low pass filter component, and can connect the second terminal of the current splitter component to the ground (e.g., ground plane) of the device. The current splitter component can be structured, and can comprise components (e.g., inductor component), such as more fully described herein.

Figure 25:
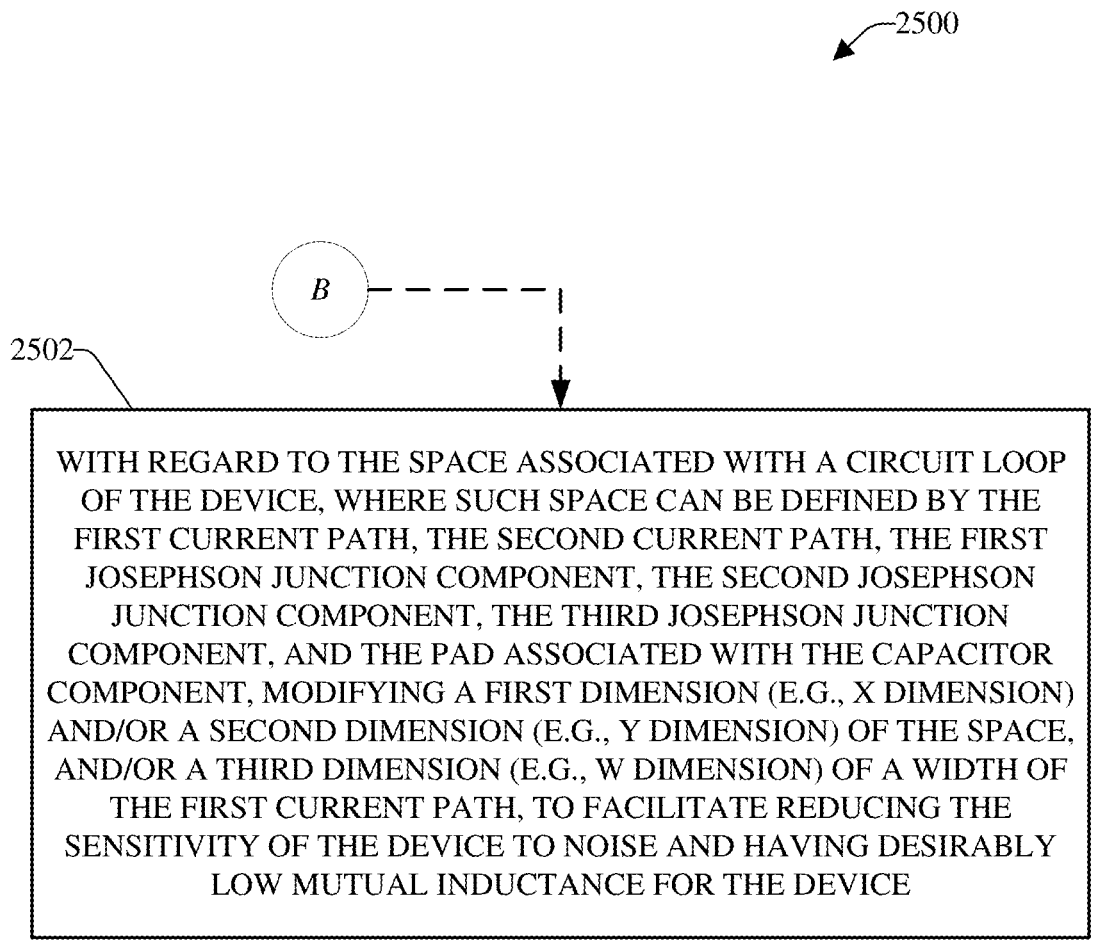
FIG. 25 illustrates a flow diagram of an example, non-limiting method for modifying or structuring the geometry of circuitry of a device that can be utilized to provide desirable current biased frequency tuning, to facilitate reducing the sensitivity of the device to noise and having desirably low mutual inductance, in accordance with various aspects and embodiments of the disclosed subject matter.

FIG. 25 illustrates a flow diagram of an example, non-limiting method 2500 for modifying or structuring the geometry of circuitry of a device that can be utilized to provide desirable (e.g., enhanced, suitable, acceptable, or optimal) current biased frequency tuning, to facilitate reducing the sensitivity of the device to noise and having desirably low mutual inductance, in accordance with various aspects and embodiments of the disclosed subject matter. The method 2500 can be performed by, for example, a system (e.g., computer system) comprising or operatively coupled to a processor component and a memory. Repetitive description of like elements employed in other embodiments described herein is or may be omitted for sake of brevity. In certain embodiments, the method 2500 can proceed from reference point B of method 2300 of FIG. 23.

At 2502, with regard to the space associated with a circuit loop of the device, where such space can be defined by the first current path, the second current path, the first Josephson junction component, the second Josephson junction component, the third Josephson junction component, and the pad associated with the capacitor component, a first dimension (e.g., X dimension) and/or a second dimension (e.g., Y dimension) of the space, and/or a third dimension (e.g., W dimension) of a width of the first current path, can be modified, to facilitate reducing the sensitivity of the device to noise and having desirably low mutual inductance for the device. For instance, in connection with designing or forming of the circuit of the device, comprising the first current path, second current path, first Josephson junction component, second Josephson junction component, third Josephson junction component, capacitor component, current generator component, and ground, with regard to the space associated with the circuit loop of the device, the system can design, determine, modify (e.g., adjust), or select the first dimension (e.g., X dimension) and/or the second dimension (e.g., Y dimension) of the space associated with the circuit loop, and/or the third dimension (e.g., W dimension) of the width of the first current path, to facilitate reducing the sensitivity of the device to noise and having desirably low mutual inductance for the device.

Figure 26:
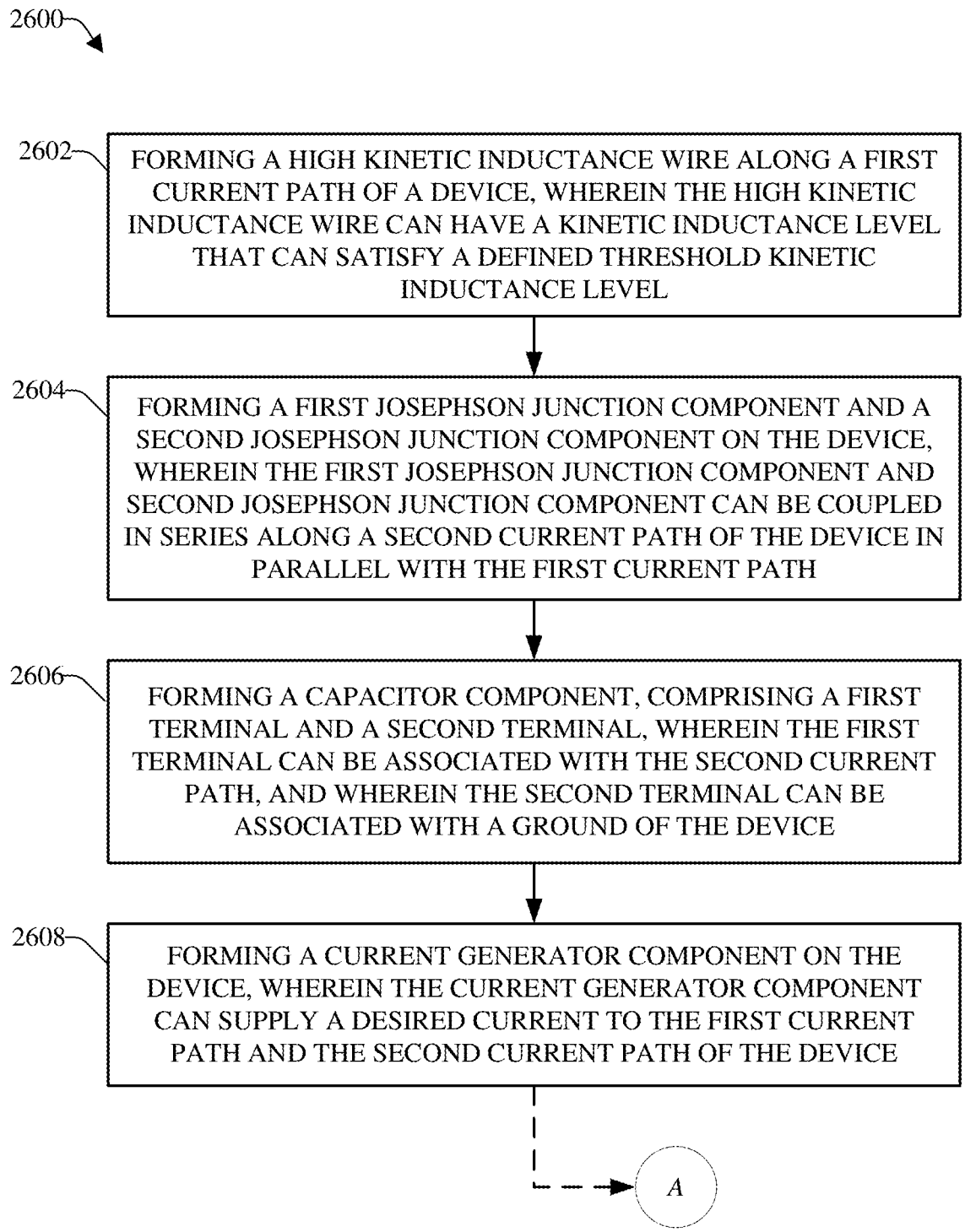
FIG. 26 depicts a flow diagram of an example, non-limiting method for forming a device that can employ a high kinetic inductance wire along with Josephson junctions to facilitate desirable current biased frequency tuning, in accordance with various aspects and embodiments of the disclosed subject matter.

FIG. 26 depicts a flow diagram of an example, non-limiting method 2600 for forming a device that can employ a high kinetic inductance wire along with Josephson junctions to facilitate desirable (e.g., enhanced, suitable, acceptable, or optimal) current biased frequency tuning, in accordance with various aspects and embodiments of the disclosed subject matter. The method 2600 can be performed by, for example, a system (e.g., computer system) comprising or operatively coupled to a processor component and a memory. Repetitive description of like elements employed in other embodiments described herein is or may be omitted for sake of brevity.

At 2602, a high kinetic inductance wire can be formed along a first current path of a device, wherein the high kinetic inductance wire can have a kinetic inductance level that can satisfy a defined threshold kinetic inductance level. At 2604, a first Josephson junction component and a second Josephson junction component can be formed on the device, wherein the first Josephson junction component and second Josephson junction component can be coupled in series along a second current path of the device in parallel with the first current path. For instance, the system can form the high kinetic inductance wire along the first current path, wherein the high kinetic inductance wire can have a kinetic inductance level that can satisfy a defined threshold kinetic inductance level (e.g., the kinetic inductance level can be sufficiently high enough to meet or exceed a defined threshold high kinetic inductance level that can indicate the kinetic inductance level has a sufficiently high value). The system also can form the first Josephson junction component and second Josephson junction component, wherein the first Josephson junction component and second Josephson junction component can be coupled in series along the second current path in parallel with the first current path of the device. The first current path also can be associated with a first inductive component having a first inductance, and the second current path can be associated with a second inductive component having a second inductance.

At 2606, a capacitor component, comprising a first terminal and a second terminal, can be formed, wherein the first terminal can be associated with the second current path, and wherein the second terminal can be associated with a ground of the device. The capacitor component can have a desired amount of capacitance, such as described herein. In some embodiments, the system can form or place (e.g., insert) the capacitor component on the device, and can connect the first terminal to the second current path, for example, between the first Josephson junction component and the second Josephson junction component, and can connect the second terminal of the capacitor component to the ground.

At 2608, a current generator component can be formed on the device, wherein the current generator component can supply a desired current to the first current path and the second current path of the device. In certain embodiments, the system can form or place (e.g., insert) the current generator component on the device, wherein an output of the current generator component can be associated with (e.g., directly or indirectly connected to) the first current path and second current path of the device.

In some embodiments, the method 2600 can proceed to reference point A, wherein the method 2400 of FIG. 24 can proceed from reference point A.

For simplicity of explanation, the methods and/or computer-implemented methods are depicted and described as a series of acts. It is to be understood and appreciated that the disclosed subject matter is not limited by the acts illustrated and/or by the order of acts, for example acts can occur in various orders and/or concurrently, and with other acts not presented and described herein. Furthermore, not all illustrated acts can be required to implement the computer-implemented methods in accordance with the disclosed subject matter. In addition, those skilled in the art will understand and appreciate that the computer-implemented methods could alternatively be represented as a series of interrelated states via a state diagram or events. Additionally, it should be further appreciated that the computer-implemented methods disclosed hereinafter and throughout this specification are capable of being stored on an article of manufacture to facilitate transporting and transferring such computer-implemented methods to computers. The term article of manufacture, as used herein, is intended to encompass a computer program accessible from any computer-readable device or storage media.

Figure 27:
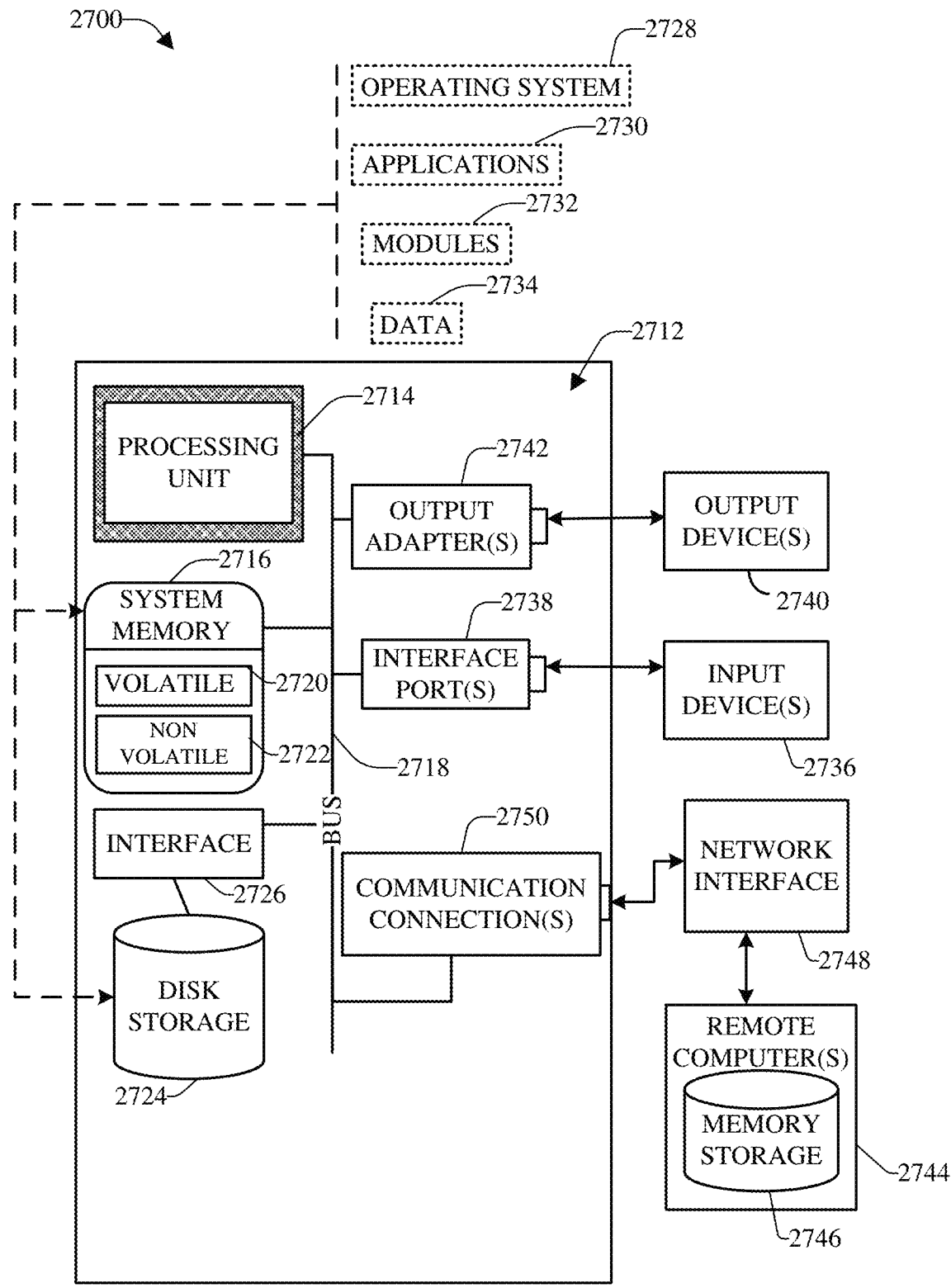
FIG. 27 illustrates a block diagram of an example, non-limiting operating environment in which one or more embodiments described herein can be facilitated.

In order to provide a context for the various aspects of the disclosed subject matter, FIG. 27 as well as the following discussion are intended to provide a general description of a suitable environment in which the various aspects of the disclosed subject matter can be implemented. FIG. 27 illustrates a block diagram of an example, non-limiting operating environment in which one or more embodiments described herein can be facilitated. Repetitive description of like elements employed in other embodiments described herein is or may be omitted for sake of brevity. With reference to FIG. 27, a suitable operating environment 2700 for implementing various aspects of this disclosure can also include a computer 2712. The computer 2712 can also include a processing unit 2714, a system memory 2716, and a system bus 2718. The system bus 2718 couples system components including, but not limited to, the system memory 2716 to the processing unit 2714. The processing unit 2714 can be any of various available processors. Dual microprocessors and other multiprocessor architectures also can be employed as the processing unit 2714. The system bus 2718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 2716 can also include volatile memory 2720 and nonvolatile memory 2722. The basic input/output system (BIOS), containing the basic routines to transfer information between elements within the computer 2712, such as during start-up, is stored in nonvolatile memory 2722. By way of illustration, and not limitation, nonvolatile memory 2722 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 2720 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM).

Computer 2712 can also include removable/non-removable, volatile/non-volatile computer storage media. FIG. 27 illustrates, for example, a disk storage 2724. Disk storage 2724 can also include, but is not limited to, devices like a magnetic disk drive, floppy disk drive, tape drive, Jaz drive, Zip drive, LS-100 drive, flash memory card, or memory stick. The disk storage 2724 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2724 to the system bus 2718, a removable or non-removable interface is typically used, such as interface 2726. FIG. 27 also depicts software that acts as an intermediary between users and the basic computer resources described in the suitable operating environment 2700. Such software can also include, for example, an operating system 2728. Operating system 2728, which can be stored on disk storage 2724, acts to control and allocate resources of the computer 2712. System applications 2730 take advantage of the management of resources by operating system 2728 through program modules 2732 and program data 2734, e.g., stored either in system memory 2716 or on disk storage 2724. It is to be appreciated that this disclosure can be implemented with various operating systems or combinations of operating systems. A user enters commands or information into the computer 2712 through input device(s) 2736. Input devices 2736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2714 through the system bus 2718 via interface port(s) 2738. Interface port(s) 2738 include, for example, a serial port, a parallel port, a game port, and a universal serial bus (USB). Output device(s) 2740 use some of the same type of ports as input device(s) 2736. Thus, for example, a USB port can be used to provide input to computer 2712, and to output information from computer 2712 to an output device 2740. Output adapter 2742 is provided to illustrate that there are some output devices 2740 like monitors, speakers, and printers, among other output devices 2740, which require special adapters. The output adapters 2742 include, by way of illustration and not limitation, video and sound cards that provide a method of connection between the output device 2740 and the system bus 2718. It should be noted that other devices and/or systems of devices provide both input and output capabilities such as remote computer(s) 2744.

Computer 2712 can operate in a networked environment using logical connections to one or more remote computers, such as remote computer(s) 2744. The remote computer(s) 2744 can be a computer, a server, a router, a network PC, a workstation, a microprocessor based appliance, a peer device or other common network node and the like, and typically can also include many or all of the elements described relative to computer 2712. For purposes of brevity, only a memory storage device 2746 is illustrated with remote computer(s) 2744. Remote computer(s) 2744 is logically connected to computer 2712 through a network interface 2748 and then physically connected via communication connection 2750. Network interface 2748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2750 refers to the hardware/software employed to connect the network interface 2748 to the system bus 2718. While communication connection 2750 is shown for illustrative clarity inside computer 2712, it can also be external to computer 2712. The hardware/software for connection to the network interface 2748 can also include, for exemplary purposes only, internal and external technologies such as, modems including regular telephone grade modems, cable modems and DSL modems, ISDN adapters, and Ethernet cards.

One or more embodiments can be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can include the following: a portable computer diskette, a hard disk, a RAM, a ROM, an erasable programmable read-only memory (EPROM or Flash memory), a SRAM, a portable CD-ROM, a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the disclosed subject matter can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the disclosed subject matter.

Aspects of disclosed subject matter are described herein with reference to flowchart illustrations and/or block diagrams of methods, apparatus (systems), and computer program products according to embodiments of the subject disclosure. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the disclosed subject matter. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the computer-implemented methods disclosed herein can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include ROM, PROM, EPROM, EEPROM, flash memory, or nonvolatile RAM (e.g., FeRAM). Volatile memory can include RAM, which can act as external cache memory, for example. By way of illustration and not limitation, RAM is available in many forms such as SRAM, DRAM, SDRAM, DDR SDRAM, ESDRAM, SLDRAM, DRRAM, DRDRAM, and RDRAM. Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a first Josephson junction located along a first current path of the device; and
   a second Josephson junction and a third Josephson junction coupled in series along a second current path of the device in parallel with the first current path, wherein the first Josephson junction is larger in area relative to the second Josephson junction and the third Josephson junction, and wherein a current splitting ratio between the first current path and the second current path is increased based on the first Josephson junction being larger in size than the second Josephson junction and the third Josephson junction.

2. The device of claim 1, wherein the device is a qubit device.

3. The device of claim 1, wherein the device is a transmon qubit device.

4. The device of claim 1, wherein the device is a current biased tunable qubit device.

5. The device of claim 1, further comprising:
   a current generator component that applies a current to the device, wherein the frequency of the device is controlled based on an amount of the current applied, via a current generator component, to the device and an arrangement of the second Josephson junction and the third Josephson junction in relation to the first Josephson junction.

6. The device of claim 1, further comprising:
   a first inductive component located along the first current path;
   a second inductive component located along the second current path; and
   a capacitor component comprising a first terminal and a second terminal, wherein the first terminal is associated with the second Josephson junction and the third Josephson junction, and wherein the second terminal is associated with a ground of the device.

7. The device of claim 1, further comprising:
   a current generator component that generates a current that passes through a low pass filter resulting in a filtered current output, wherein at least a portion of a filtered current output is supplied to the first current path and the second current path, and wherein the low pass filter is constructed to have a defined cutoff frequency; and
   a current splitter component that diverts another portion of the filtered current output to a ground of the device.

8. A method, comprising:
   forming a first Josephson junction along a first current path of a device; and
   forming a second Josephson junction and a third Josephson junction that are coupled in series along a second current path of the device in parallel with the first current path, wherein the first Josephson junction is larger in area relative to the second Josephson junction and the third Josephson junction, and wherein a current splitting ratio between the first current path and the second current path is increased based on the first Josephson junction being larger in size than the second Josephson junction and the third Josephson junction.

9. The method of claim 8, wherein the device is a qubit device.

10. The method of claim 8, wherein the qubit device is a transmon qubit device.

11. The method of claim 8, further comprising:
applying a current to the device, where a frequency of the device is tuned based on a level of the current applied to the device and an arrangement of the second Josephson junction and the third Josephson junction in relation to the first Josephson junction.

12. The method of claim 8, wherein the first current path is associated with a first wire having a first inductance level, and wherein the second current path is associated with a second wire having a second inductance level.

13. The method of claim 8, further comprising:
forming a capacitor comprising a first terminal and a second terminal, wherein the first terminal is associated with the second current path, and wherein the second terminal is associated with a ground of the device.

14. The method of claim 8, further comprising:
applying a current to the device.

15. The method of claim 14, wherein the current passes through a low pass filter to produce a filtered current output, and diverting a first portion of the filtered current output to the first current path and the second current path.

16. The method of claim 15, further comprising:
diverting a second portion of the filtered current output to a ground of the device.

17. A qubit device, comprising:
a high kinetic inductance wire located along a first current path of the device, wherein the high kinetic inductance wire has a kinetic inductance level that satisfies a defined threshold kinetic inductance level; and
a first Josephson junction and a second Josephson junction coupled in series along a second current path of the device in parallel with the first current path, wherein the first Josephson junction and the second Josephson junction facilitate adjusting a frequency of the qubit device, and wherein the frequency of the qubit device is adjusted based on an amount of current applied to the qubit device and an arrangement of the first Josephson junction and the second Josephson junction in relation to the high kinetic inductance wire.

18. The qubit device of claim 17, wherein the qubit device is a transmon qubit device.

19. The qubit device of claim 17, wherein a current splitting ratio between the first current path and the second current path is based on a relationship between the high kinetic inductance wire, the first Josephson junction, and the second Josephson junction.

20. The qubit device of claim 17, further comprising:
a first inductive component located along the first current path;
a second inductive component located along the second current path; and
a capacitor component comprising a first terminal and a second terminal, wherein the first terminal is associated with the second current path, and wherein the second terminal is associated with a ground of the qubit device.

* * * * *